United States Patent
Lee et al.

(10) Patent No.: US 10,891,008 B2
(45) Date of Patent: Jan. 12, 2021

(54) TOUCH DISPLAY DEVICE AND TOUCH PANEL TO REDUCE UNDESIRED CAPACITANCE

(71) Applicant: LG Display Co., Ltd., Seoul (KR)

(72) Inventors: JaeGyun Lee, Gyeonggi-do (KR); DeukSu Lee, Gyeonggi-do (KR); SuChang An, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 26 days.

(21) Appl. No.: 15/994,503

(22) Filed: May 31, 2018

(65) Prior Publication Data
US 2018/0348912 A1     Dec. 6, 2018

(30) Foreign Application Priority Data
Jun. 1, 2017  (KR) .................. 10-2017-0068391

(51) Int. Cl.
| G06F 3/044 | (2006.01) |
| G06F 3/041 | (2006.01) |
| H01L 51/52 | (2006.01) |
| G09G 3/3291 | (2016.01) |
| H01L 27/32 | (2006.01) |

(52) U.S. Cl.
CPC ............ *G06F 3/044* (2013.01); *G06F 3/0412* (2013.01); *G06F 3/0416* (2013.01); *G09G 3/3291* (2013.01); *H01L 51/5221* (2013.01); *H01L 51/5237* (2013.01); *G06F 2203/04104* (2013.01); *G06F 2203/04111* (2013.01); *G06F 2203/04112* (2013.01); *H01L 27/323* (2013.01)

(58) Field of Classification Search
CPC .................. G06F 3/044; G06F 3/0412; G06F 2203/04111; G06F 2203/04112; G06F 2203/04113
See application file for complete search history.

(56) References Cited

U.S. PATENT DOCUMENTS

| 9,176,611 | B2* | 11/2015 | Kim | .................. G06F 3/044 |
| 2013/0328830 | A1* | 12/2013 | Han | .................. G06F 3/0418 345/174 |
| 2014/0204283 | A1* | 7/2014 | Huh | .................. G06F 3/044 349/12 |
| 2016/0195983 | A1* | 7/2016 | Miyake | .................. G06F 3/044 345/174 |
| 2017/0344141 | A1* | 11/2017 | Lee | .................. G06F 3/03547 |

FOREIGN PATENT DOCUMENTS

KR    20130071721 A    7/2013

OTHER PUBLICATIONS

Search and Examination Report dated Dec. 12, 2018 issued in the corresponding United Kingdom Application No. 1809010.0, pp. 1-6.

* cited by examiner

*Primary Examiner* — Kevin M Nguyen
(74) *Attorney, Agent, or Firm* — Polsinelli PC

(57) ABSTRACT

Aspects relate to a touch display device and a touch panel and, more particularly to, a touch display device and a touch panel which may prevent a large unnecessary and undesired capacitance between a bridge and a surrounding touch electrode through a change in a bridge structure for an electrical connection between the touch electrodes, thereby obtaining excellent touch sensitivity.

23 Claims, 20 Drawing Sheets

Mesh Type TE

TOUCH DISPLAY DEVICE AND TOUCH PANEL TO REDUCE UNDESIRED CAPACITANCE

CROSS REFERENCE TO RELATED APPLICATION

This application claims priority from Korean Patent Application No. 10-2017-0068391, filed on Jun. 1, 2017, which is hereby incorporated by reference for all purposes as if fully set forth herein.

BACKGROUND

Field of the Disclosure

The present disclosure relates to a touch display device and a touch panel.

Description of the Background

With development of the information society, a demand for a display device for displaying an image has increased in various forms. Recently, various display devices such as a liquid crystal display device, a plasma display device, an organic light emitting display device, and the like have been utilized.

Among these display devices, there is a touch display device that provides a touch-based input method that allows a user to easily input information or commands intuitively and conveniently, out of the conventional input method using a button, a keyboard, a mouse, or the like.

In order for such a touch display device to provide the touch-based input method, it is necessary to determine the presence or absence of a user's touch and accurately detect touch coordinates.

To this end, a capacitance-based touch sensing method for detecting the presence or absence of a touch, touch coordinates, etc., based on a change in capacitance which is formed on a touch electrode through a plurality of touch electrodes formed on a touch panel is widely used among various touch sensing methods.

Since a plurality of touch electrodes are arranged in a complex shape on a touch panel of the conventional touch display device, large unnecessary and undesired capacitance is formed due to various factors such as structure, position, or arrangement of the touch electrodes, and the like.

SUMMARY

Accordingly, the present disclosure is to provide a touch display device and a touch panel which may prevent large unnecessary and undesired capacitance, thereby achieving excellent touch sensitivity.

Another aspect of the present disclosure is to provide a touch display device and a touch panel which may prevent a large unnecessary and undesired capacitance between a bridge for an electrical connection between touch electrodes and surrounding touch electrodes, thereby achieving excellent touch sensitivity.

In accordance with an aspect of the present disclosure, there is provided a touch display device including: a touch panel in which a plurality of touch electrodes is arranged on a touch electrode layer; and a touch circuit configured to drive the touch panel and senses the presence or absence of a touch or a touch position.

Each of the plurality of touch electrodes may be an electrode metal patterned in the form of a mesh.

The plurality of touch electrodes may include a first touch electrode, a second touch electrode, a third touch electrode, and a fourth touch electrode.

The first touch electrode and the third touch electrode may be electrically connected to each other, and the second touch electrode and the fourth touch electrode are electrically connected to each other.

The first touch electrode and the third touch electrode may be integrated to be electrically connected to each other or may be electrically connected to each other through another bridge.

The second touch electrode and the fourth touch electrode may be electrically connected to each other through a first bridge present in a bridge layer which is a different layer from the touch electrode layer.

The first bridge may pass through an area of the first touch electrode.

An electrode metal pattern of the first touch electrode in an area through which the first bridge passes may be different from an electrode metal pattern of the first touch electrode in an area through which the first bridge does not pass.

The first touch electrode and the third touch electrode may be arranged adjacent to each other in a row direction or a column direction, and the second touch electrode and the fourth touch electrode may be arranged adjacent to each other in the column direction or the row direction.

The first touch electrode, the second touch electrode, the third touch electrode, and the fourth touch electrode may be arranged in a rhombic shape.

Each of the first touch electrode, the second touch electrode, the third touch electrode, and the fourth touch electrode may be the electrode metal patterned in the form of a mesh having a rhombic hole.

The first bridge may be bent at a portion thereof passing through the area of the first touch electrode, and may include a first diagonal portion in a first diagonal direction and a second diagonal portion in a second diagonal direction with respect to the bent point.

The first diagonal portion and the second diagonal portion in the first bridge may be respectively parallel to a first side and a second side among four sides of the rhombic hole of the electrode metal corresponding to the first touch electrode.

The electrode metal pattern of the first touch electrode in the area through which the first bridge passes may be a pattern in which the electrode metal patterned in the same direction as a direction of the first bridge is absent.

In contrast, the electrode metal pattern of the first touch electrode in the area through which the first bridge does not pass may be a pattern in which the electrode metal patterned in the same direction as the direction of the first bridge is present.

The first bridge may be a multi-line bridge metal.

The first bridge may include a portion patterned in the form of a mesh.

The first bridge may include the same portion as the electrode metal pattern of the touch electrode.

The touch display device may further include a second bridge for an additional electrical connection between the second touch electrode and the fourth touch electrode.

The second bridge may have a symmetrical arrangement with the first bridge.

The second bridge may pass through an area of the third touch electrode.

An electrode metal pattern of the third touch electrode in an area through which the second bridge passes may be different from an electrode metal pattern of the third touch electrode in an area through which the second bridge does not pass.

The electrode metal pattern of the third touch electrode in the area through which the second bridge passes is a pattern in which an electrode metal patterned in the same direction as a direction of the second bridge is absent.

The electrode metal pattern of the third touch electrode in the area through which the second bridge does not pass is a pattern in which an electrode metal patterned in the same direction as the direction of the second bridge is present.

The first bridge and the second bridge may be separated from each other or integrated.

The bridge layer is located below or above the touch electrode layer.

The touch circuit may supply a touch driving signal to the first touch electrode and the third touch electrode, and detect a touch sensing signal to the second touch electrode and the fourth touch electrode.

Alternatively, the touch circuit may supply a touch driving signal to the second touch electrode and the fourth touch electrode, and detect a touch sensing signal to the first touch electrode and the third touch electrode.

One or more dummy metals which are disconnected from the electrode metal patterned in the form of a mesh may be present in an area of all or some of the plurality of touch electrodes.

The electrode metal and the dummy metal may be the same material.

The plurality of touch electrodes may be located on an encapsulation layer.

A plurality of open areas may be present in an area of each of the plurality of touch electrodes.

One open area may correspond to a light emitting portion of one or more subpixels on the display panel.

The plurality of open areas may correspond to a plurality of color filters.

The plurality of color filters may be located on the plurality of touch electrodes.

Alternatively, the plurality of color filters may be located on the encapsulation layer while being located below the plurality of touch electrodes.

In accordance with another aspect of the present disclosure, there is provided a touch panel including: a first touch electrode; a second touch electrode configured to be arranged adjacent to the first touch electrode; a third touch electrode configured to be electrically connected to the first touch electrode; and a fourth touch electrode configured to be electrically connected to the second touch electrode.

Each of the first touch electrode, the second touch electrode, the third touch electrode, and the fourth touch electrode may be an electrode metal patterned in the form of a mesh.

The touch panel may further include a first bridge configured to electrically connect the second touch electrode and the fourth touch electrode and to be present in a bridge layer different from a touch electrode layer.

The first bridge may pass through an area of the first touch electrode.

An electrode metal pattern of the first touch electrode in an area through which the first bridge passes may be different from an electrode metal pattern of the first touch electrode in an area through which the first bridge does not pass.

The first touch electrode and the third touch electrode may be integrated to be electrically connected to each other or may be electrically connected to each other through another bridge.

As described above, according to aspects of the present disclosure, it is possible to provide a touch display device and a touch panel which may prevent a large unnecessary and undesired capacitance and thereby obtain excellent touch sensitivity.

Further, according to aspects of the present disclosure, it is possible to provide a touch display device and a touch panel which may prevent a large undesired and undesired capacitance between a bridge for an electrical connection between touch electrodes and the surrounding touch electrodes and thereby obtain excellent touch sensitivity.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
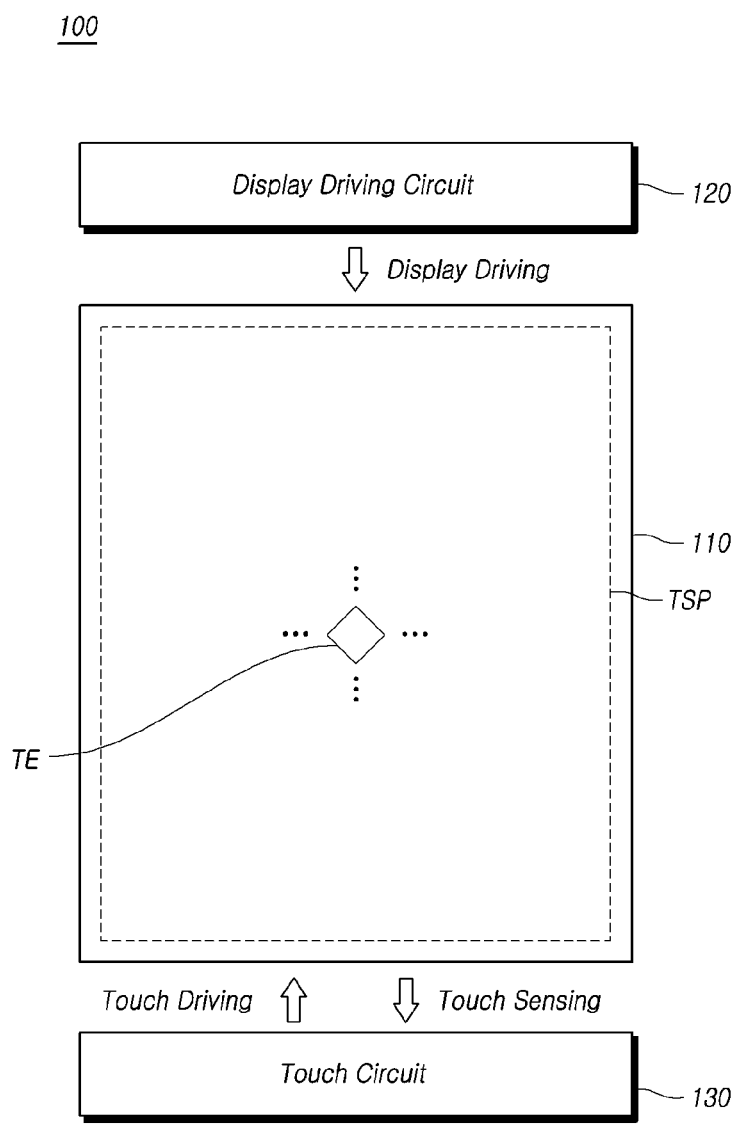
FIG. 1 is a system configuration diagram of a touch display device according to the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a system configuration diagram of a touch display device 100 according to the present disclosure.

Referring to FIG. 1, the touch display device 100 according to the present disclosure provides an image display function for displaying an image and a touch sensing function for sensing a user's touch.

The touch display device 100 according to the present disclosure may include a display panel 110 in which data lines and gate lines are arranged for displaying an image, a display driving circuit 120 for driving the display panel 110, and the like.

The display driving circuit 120 may functionally include a data driving circuit for driving the data lines, a gate driving circuit for driving the gate lines, a controller for controlling the data driving circuit and the gate driving circuit, and the like.

The display driving circuit 120 may be implemented with one or more integrated circuits.

The touch display device 100 according to the present disclosure may include a touch screen panel (TSP) in which a plurality of touch electrodes (TEs) acting as a touch sensor are arranged for touch sensing, a touch circuit 130 for performing driving and sensing of the TSP, and the like.

The touch circuit 130 supplies a touch driving signal to the TSP to drive the TSP, detects a touch sensing signal from the TSP, and senses the presence or absence of a touch and/or a touch position (touch coordinates) based on the detected touch sensing signal.

Such a touch circuit 130 may be implemented including a touch driving circuit for supplying the touch driving signal and receiving the touch sensing signal, a touch controller for calculating the presence or absence of a touch and/or a touch position (i.e., touch coordinates), and the like.

The touch circuit 130 may be implemented as one or two or more components (e.g., an integrated circuit), and may be implemented separately from the display driving circuit 120.

In addition, the entirety or a portion of the touch circuit 130 may be integrated with the display driving circuit 120 or an internal circuit thereof and may be implemented. For example, the touch driving circuit of the touch circuit 130 may be implemented as an integrated circuit together with the data driving circuit of the display driving circuit 120.

Meanwhile, the touch display device 100 according to the present disclosure may sense a touch based on capacitance formed on the TEs.

The touch display device 100 according to the present disclosure may sense a touch in a mutual-capacitance-based touch sensing method or a self-capacitance-based touch sensing method as a capacitance-based touch sensing method.

In the case of the mutual-capacitance-based touch sensing method, a plurality of TEs can be classified into driving touch electrodes (also referred to as driving electrodes, transmission electrodes, or driving lines) to which the touch driving signal is applied and sensing touch electrodes (also referred to as sensing electrodes, reception electrodes, or sensing lines) which sense the touch sensing signal and form capacitance with the driving electrodes.

Among the driving touch electrodes in the TEs, the driving touch electrodes arranged in the same row (or the same column) are electrically connected to each other to form one driving touch electrode line.

Among the sensing touch electrodes in the TEs, the sensing touch electrodes arranged in the same column (or the same row) are electrically connected to each other to form one sensing touch electrode line.

In the case of such a mutual-capacitance-based touch sensing method, the presence and absence of a touch and/or touch coordinates are detected based on a change in the capacitance (mutual-capacitance) between the driving touch electrode (driving touch electrode line) and the sensing touch electrode (sensing touch electrode line) according to the presence or absence of a pointer such as a finger or a pen.

In the case of the self-capacitance-based touch sensing method, each TE serves as both the driving touch electrode (applying the touch driving signal) and the sensing touch electrode (detecting the touch sensing signal).

That is, the touch driving signal is applied to each TE and the touch sensing signal is received through the TE to which the touch driving signal is applied. Therefore, in the self-capacitance-based touch sensing method, there is no distinction between the driving electrode and the sensing electrode.

In the case of the self-capacitance-based touch sensing method, the presence or absence of a touch and/or touch coordinates are detected based on a change in the capacitance between a pointer such as a finger or a pen and a TE.

In this manner, the touch display device 100 according to the present disclosure may sense a touch in the mutual-capacitance-based touch sensing method or the self-capacitance-based touch sensing method.

Hereinafter, for convenience of description, an improved structure for improving touch sensitivity will be described focusing on the touch display device 100 and the TSP which adopt the mutual-capacitance-based touch sensing method.

However, the improved structure for improving the touch sensitivity can be similarly applied to the touch display device 100 and the TSP which adopt the self-capacitance-based touch sensing method.

In addition, the display panel 110 of the touch display device 100 according to the present disclosure may be of various types such as an organic light emitting diode (OLED) panel, a liquid crystal display (LCD) panel, and the like. Hereinafter, for convenience of description, an OLED panel will be mainly described as an example.

Figure 2:
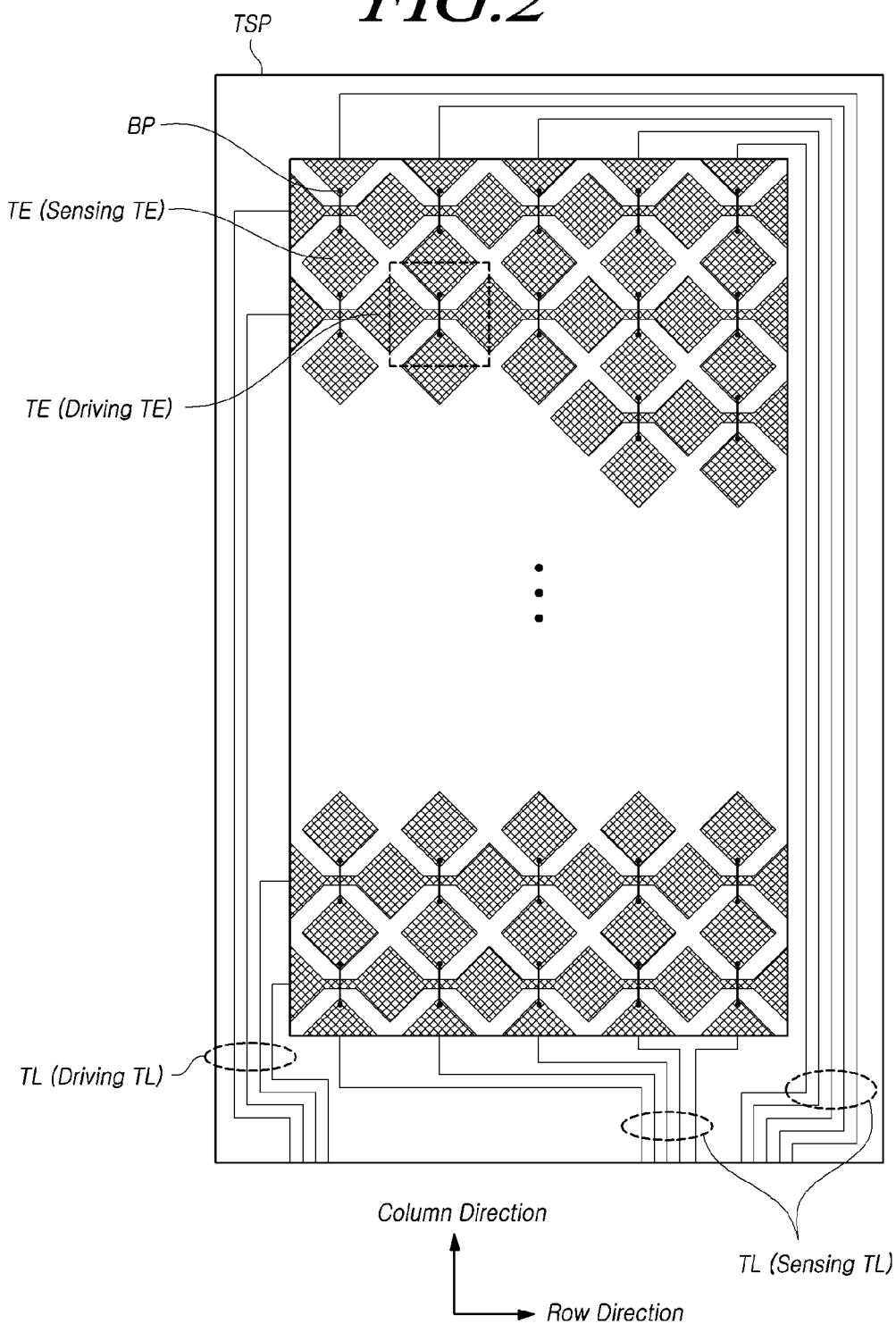
FIG. 2 is a diagram illustrating a touch panel according to the present disclosure.

FIG. 2 is a diagram illustrating a touch screen panel (TSP) according to aspects.

Referring to FIG. 2, on the TSP, a plurality of touch electrodes (TEs) and touch lines (TLs) electrically connecting the TEs and the touch circuit 130 may be arranged.

In addition, on the TSP, there may be touch pads where the touch circuit 130 contacts in order to electrically connect the TLs and the touch circuit 130.

The TEs and the TLs may be present in the same layer or in different layers.

Meanwhile, when the touch display device 100 adopts the mutual-capacitance-based touch sensing method, two or more TEs arranged in the same row (or the same column) are electrically connected to each other to form one driving touch electrode (TE) line. The two or more TEs arranged in the same column (or the same row) may be electrically connected to each other to form one sensing touch electrode (TE) line.

The two or more TEs forming one driving TE line are referred to as driving TEs. The two or more TEs forming one sensing TE line are referred to as sensing TEs.

At least one TL may be connected to each driving TE line, and at least one TL may be connected to each sensing TE line.

The at least one TL connected to each driving TE line is referred to as a driving TL. The at least one TL connected to each sensing TE line is referred to as a sensing TL.

One touch pad (TP) may be connected to each TL.

Referring to FIG. 2, each of the plurality of TEs may have, for example, a rhombus shape when the outline of the outer periphery thereof is viewed. In some cases, it may have a rectangular shape (may include a square) or may have various shapes.

The shape of the TE can be variously designed in consideration of the display performance and touch performance of the touch display device 100.

The TSP illustrated in FIG. 2 is long in the column direction. However, the TSP may be designed to be long in the row direction depending on the type (e.g., TV, monitor, mobile terminal, etc.) or design of the touch display device 100.

The TSP according to present disclosure may be present outside the display panel 110 (external type), but may be present inside the display panel 110 (internal-type).

When the TSP is of external type, the TSP and the display panel 110 may be manufactured through different panel manufacturing processes and then may be bonded.

When the TSP is of internal type, the TSP and the display panel 110 may be made together through one panel manufacturing process.

When the TSP is of an internal-type, the TSP can be regarded as a collection of the plurality of TEs. Here, a plate on which the plurality of TEs is placed may be a dedicated substrate or may be a layer (e.g., an encapsulation layer) which has been already present in the display panel 110.

Figure 3:
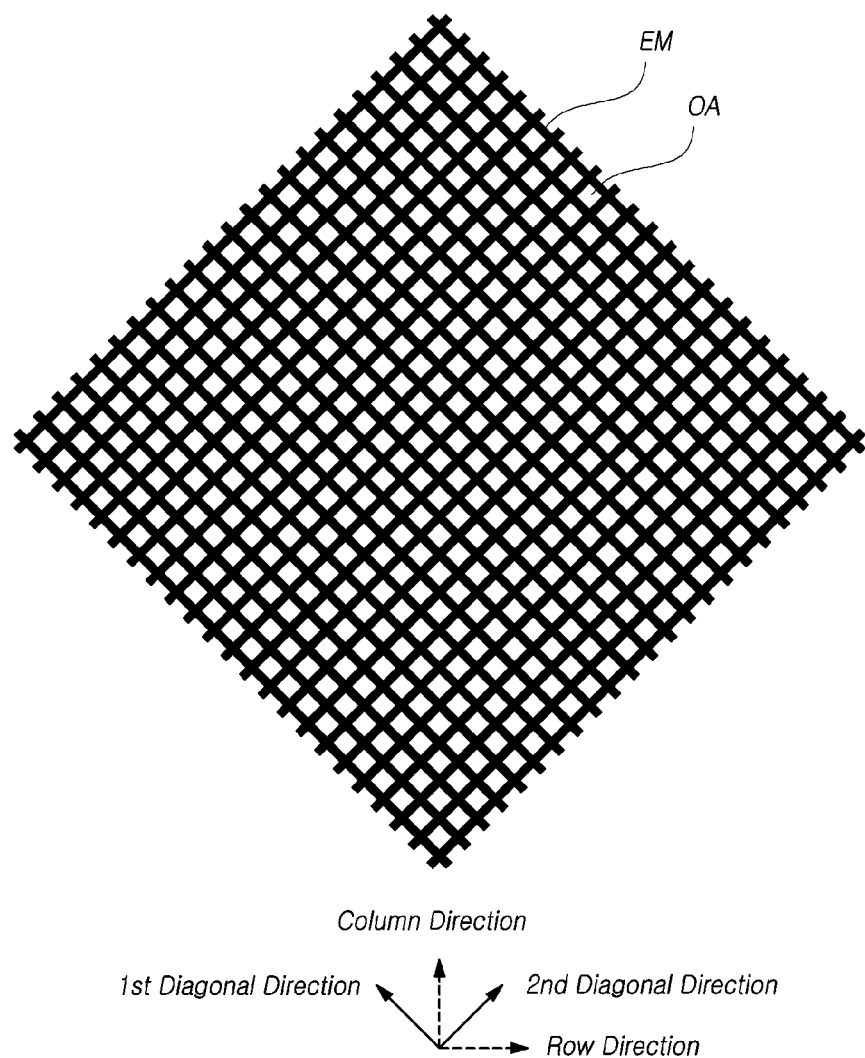
FIG. 3 is a diagram illustrating a touch electrode on a touch panel according to the present disclosure.

FIG. 3 is a diagram illustrating one touch electrode (TE) or a portion thereof on a touch screen panel (TSP) according to present disclosure.

In the TSP according to present disclosure, each of a plurality of TEs may be an electrode metal (EM) patterned in the form of a mesh. Hereinafter, the EM may be used in the same sense as the TE.

According to such a mesh-shaped touch electrode structure, a plurality of open areas (OAs) corresponding to the holes of the mesh may be present in an area of one TE.

As described above, the rough outline of the outer periphery of one TE may be a rhombus or a rectangle (may include a square), and the OAs corresponding to the holes in one TE may also be a rhombus or a rectangle (may include a square).

The rough outline of the outer periphery of one TE and the shape of the OAs corresponding to the holes in one TE may be the same or different.

Figure 4:
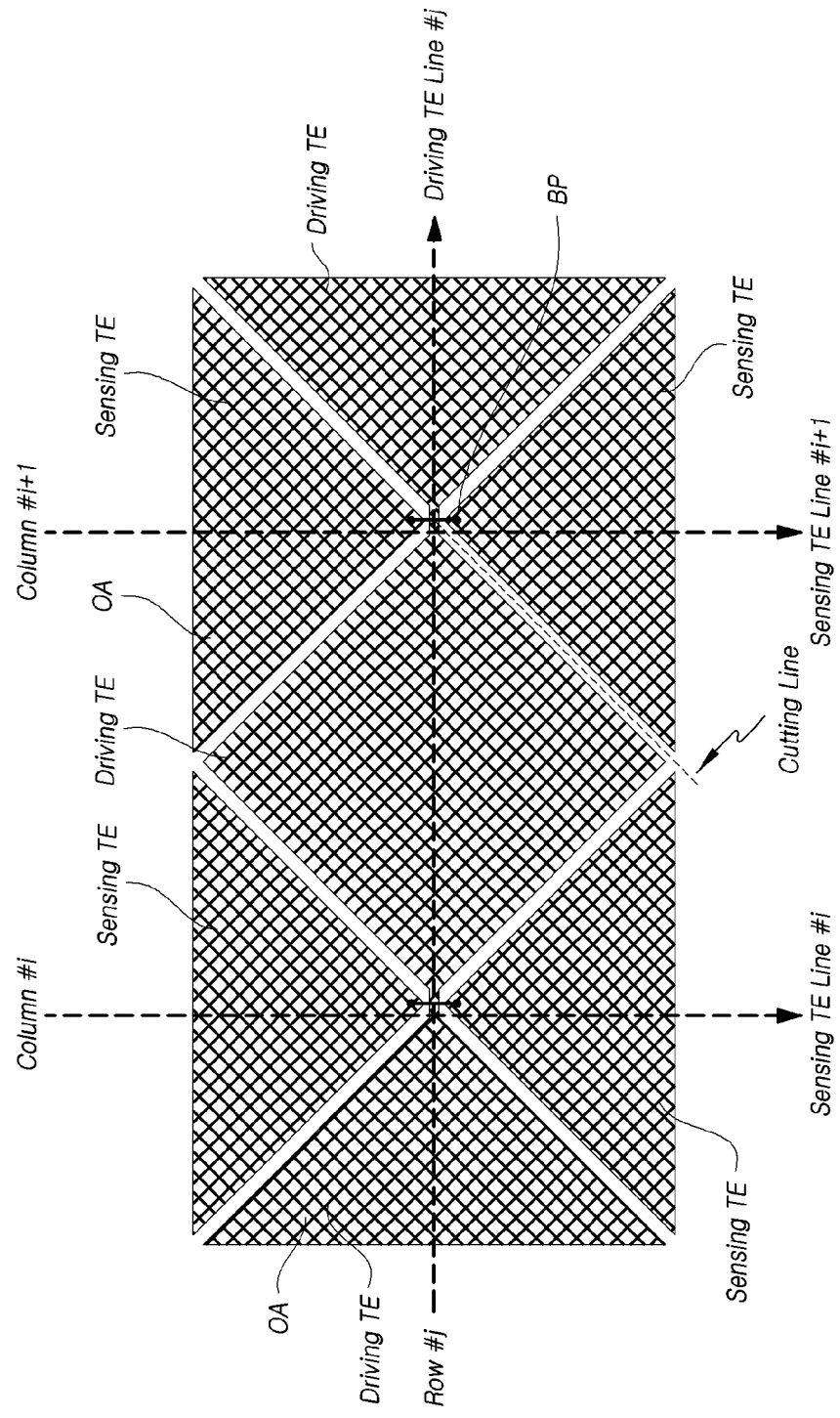
FIG. 4 is a diagram illustrating a portion of a touch panel according to the present disclosure.

FIG. 4 is a diagram illustrating a portion of a touch screen panel (TSP) according to aspects.

FIG. 4 is a diagram illustrating seven touch electrodes (TEs) when the TE is made of a mesh-type electrode metal (EM) having open areas (OAs) as shown in FIG. 3.

In FIG. 4, the seven TEs include three driving TEs and four sensing TEs.

Two sensing TEs arranged in an i-th column among the four sensing TEs form an i-th sensing TE line #i.

For example, the two sensing TEs arranged in the i-th column may be electrically connected to each other through a bridge pattern (BP) existing in a layer different from that of the two sensing TEs arranged in the i-th column.

As another example, the two sensing TEs arranged in the i-th column may be integrally formed and electrically connected to each other.

Two sensing TEs arranged in an (i+1)-th column among the four sensing TEs form an (i+1)-th sensing TE line #i+1.

For example, the two sensing TEs arranged in the (i+1)-th column may be electrically connected to each other through a BP existing in a layer different from that of the two sensing TEs arranged in the (i+1)-th column.

As another example, the two sensing TEs arranged in the (i+1)-th column may be integrally formed and electrically connected to each other.

The three driving TEs are arranged in a j-th row to form a j-th driving TE line #j.

For example, the three driving TEs arranged in the j-th row may be integrally formed and electrically connected to each other.

As another example, the three driving TEs arranged in the j-th row may be electrically connected to each other through a BP existing in a layer different from that of the three driving TEs arranged in the j-th row.

Referring to FIG. 4, as to all of the TEs including the three driving TEs and the four sensing TEs, the driving TE and the sensing TE may be formed after forming widely an electrode metal (EM) and then cutting the EM in a fixed pattern.

Figure 5:
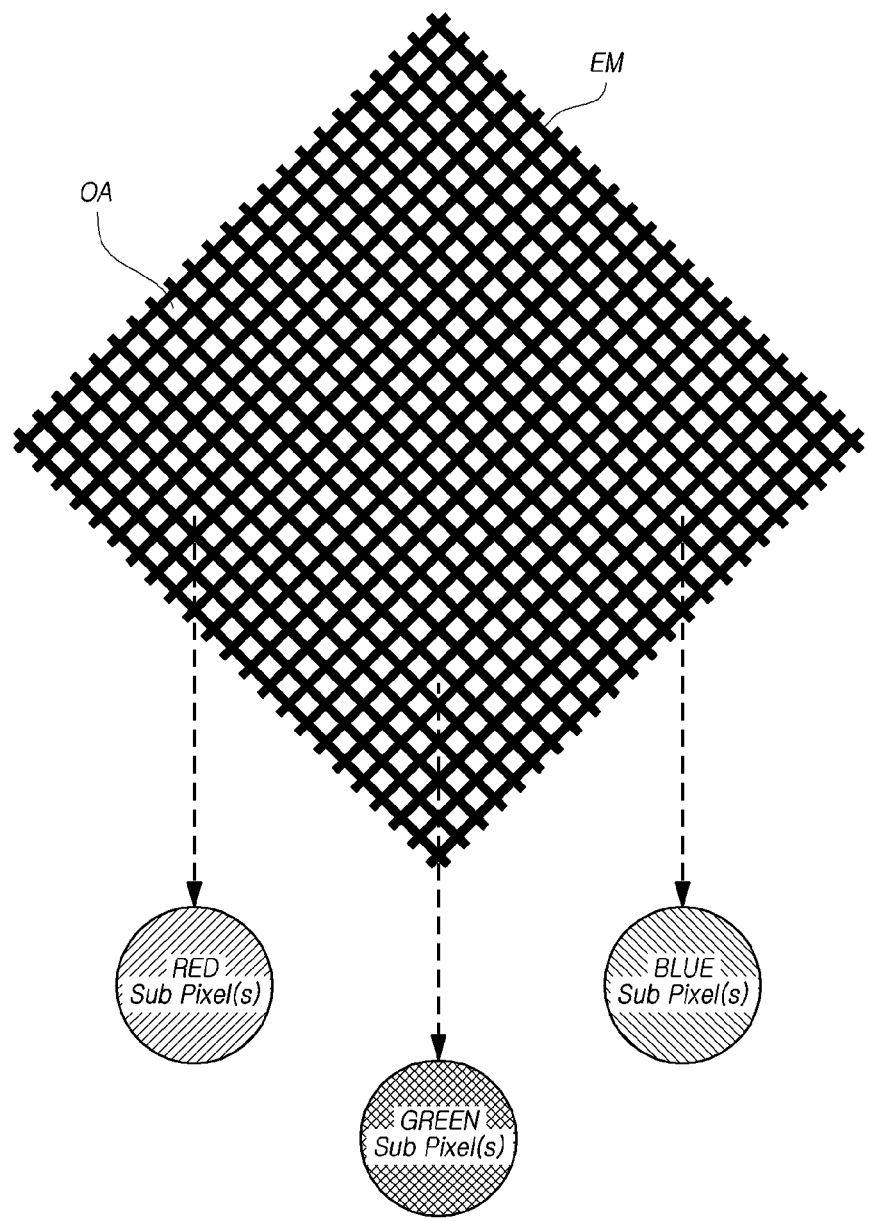
FIG. 5 is a diagram illustrating a positional relationship between an open area and a subpixel of a touch electrode on a touch display device according to the present disclosure.

FIG. 5 is a diagram illustrating a positional relationship between an open area (OA) and a subpixel of a touch electrode (TE) on a touch display device 100 according to present disclosure.

Each touch electrode (TE) is an electrode metal (EM) patterned in the form of a mesh having a plurality of open areas (OAs).

Each of the plurality of OAs existing in the area of each TE may correspond in position to a light emitting portion of one or more subpixels.

When the display panel 110 is an LCD panel, the light emitting portion of the subpixel may include a pixel electrode or a color filter. When the display panel 110 is an OLED panel, the light emitting portion of the subpixel may include an anode electrode of an organic light emitting diode (OLED), an organic light emitting layer, or the like. In some cases, the light emitting portion of the subpixel may include a color filter or the like.

As described above, the light emitting portion of one or more subpixels is present in each of the OAs of the respective TEs when seen in a plan view, and thereby it is possible to increase an aperture ratio and luminous efficiency of the display panel 110.

Meanwhile, in order to further increase the aperture ratio and the luminous efficiency of the display panel 110, a circuit portion (a portion where a transistor or the like is formed) of each subpixel may be present to overlap the EM without corresponding in position to the OA.

The subpixels may consist of red subpixels, green subpixels, and blue subpixels. In some cases, the subpixels may consist of red subpixels, white subpixels, green subpixels, and blue subpixels.

Figure 6:
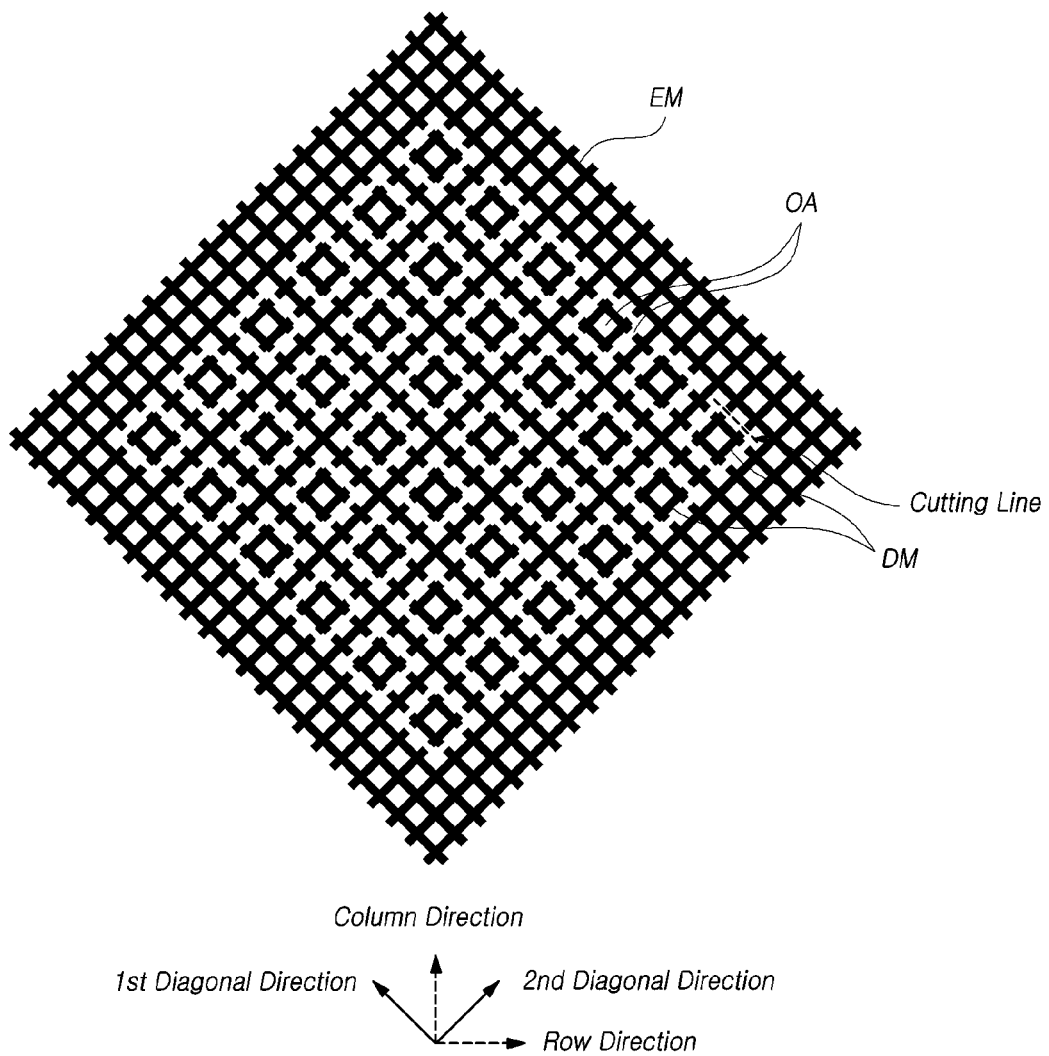
FIG. 6 is a diagram illustrating a touch electrode in a case in which a dummy metal is present in an area of a touch electrode, on a touch panel according to the present disclosure.
Figure 7:
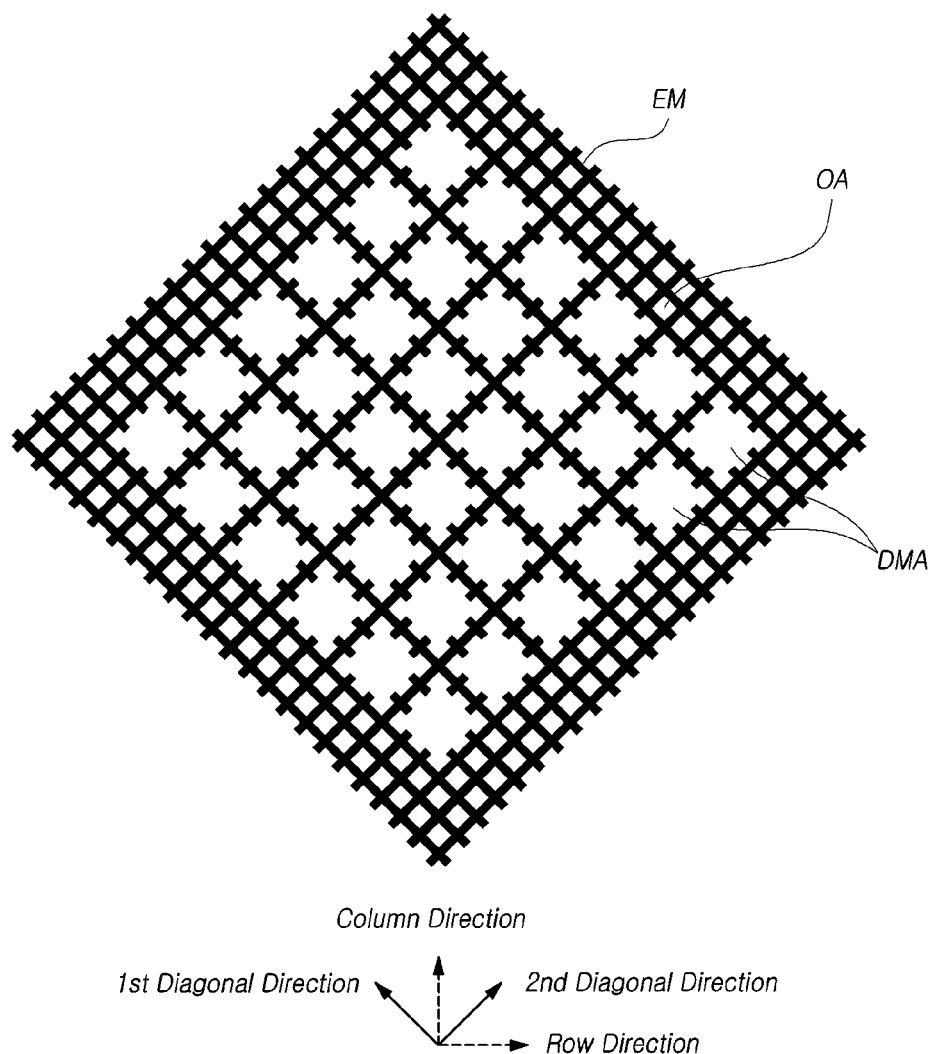
FIG. 7 is a diagram illustrating a touch electrode by removing the dummy metal and displaying only an electrode metal in FIG. 6.

FIG. 6 is a diagram illustrating a touch electrode (TE) in a case in which a dummy metal (DM) is present in an area of the TE, on a touch screen panel (TSP) according to present disclosure. FIG. 7 is a diagram illustrating a touch electrode (TE) by removing the dummy metal (DM) and displaying only an electrode metal (EM) in FIG. 6.

Referring to FIG. 6, each TE is an EM patterned in the form of a mesh, and a plurality of open areas (OAs) is present in an area of each TE.

In the area of all or some of the plurality of TEs arranged on the TSP, there may be one or more DMs which are disconnected from the EM patterned in the form of a mesh.

The EM in the area of one TE corresponds to a substantial TE and is a portion where a touch driving signal is applied or a touch sensing signal is sensed (detected).

Although the DM in the area of one TE is present in the area of the TE, the DM in the area of one TE may be a portion where a touch driving signal is not applied and a touch sensing signal is not detected, which may be referred to as a floating pattern.

In addition, the EM may be electrically connected to the touch circuit 130, but the DM is not electrically connected to the touch circuit 130.

As described above, one or more DMs may be present in a state of being disconnected from the EM in the area of each of all the TEs.

Alternatively, one or more DMs may be present in a state of being disconnected from the EM only in the area of each of some of all the TEs. That is, the DM may not be present in the areas of some of the TEs.

Meanwhile, when one or more DMs is not present and only the EM is present in the form of a mesh in the area of one TE, there may be a problem of visibility of the outline of the EM on a screen.

However, by forming the DM in the area of the TE, it is possible to prevent the problem of visibility that may occur when one TE is patterned in the form of a mesh.

In addition, by adjusting the presence or absence of the DM or the number of DMs (DM ratio) for each TE, it is possible to improve touch sensitivity by adjusting the magnitude of a capacitance for each TE.

The EM is patterned in the form of a mesh, and then the EM patterned in the form of a mesh is cut to form a TE (TE formation cutting).

Thereafter, the EM patterned in the form of a mesh in the area of one TE is cut into a predetermined pattern (DM formation cutting) to form the DM that is disconnected from the EM.

In the case in which the DM is formed, the DM is a portion that is disconnected from the EM.

Therefore, the EM and the DM may be the same material and may be present on the same layer.

According to the above-described method of forming the DM, the DM may be more easily formed and the EM and the DM may be formed on a single layer.

FIG. 7 is a diagram illustrating a TE showing only the EM serving as a substantial electrode by omitting the display of the DM in FIG. 6.

That is, FIG. 7 shows a TE that does not display a DM present in a dummy metal area (DMA).

Here, serving as the substantial electrode means that a touch driving signal is applied or a touch sensing signal is detected.

Referring to FIG. 7, in the mesh pattern of the EM, the EM is patterned densely in the outer peripheral portion where no DM is present, and the EM is patterned less densely by a space where the DM is removed on the inner side where the DM is present.

Hereinafter, for convenience of description, in the TE, the DM may be omitted and only the EM in the form of a mesh serving as the substantial electrode may be displayed.

Figure 8:
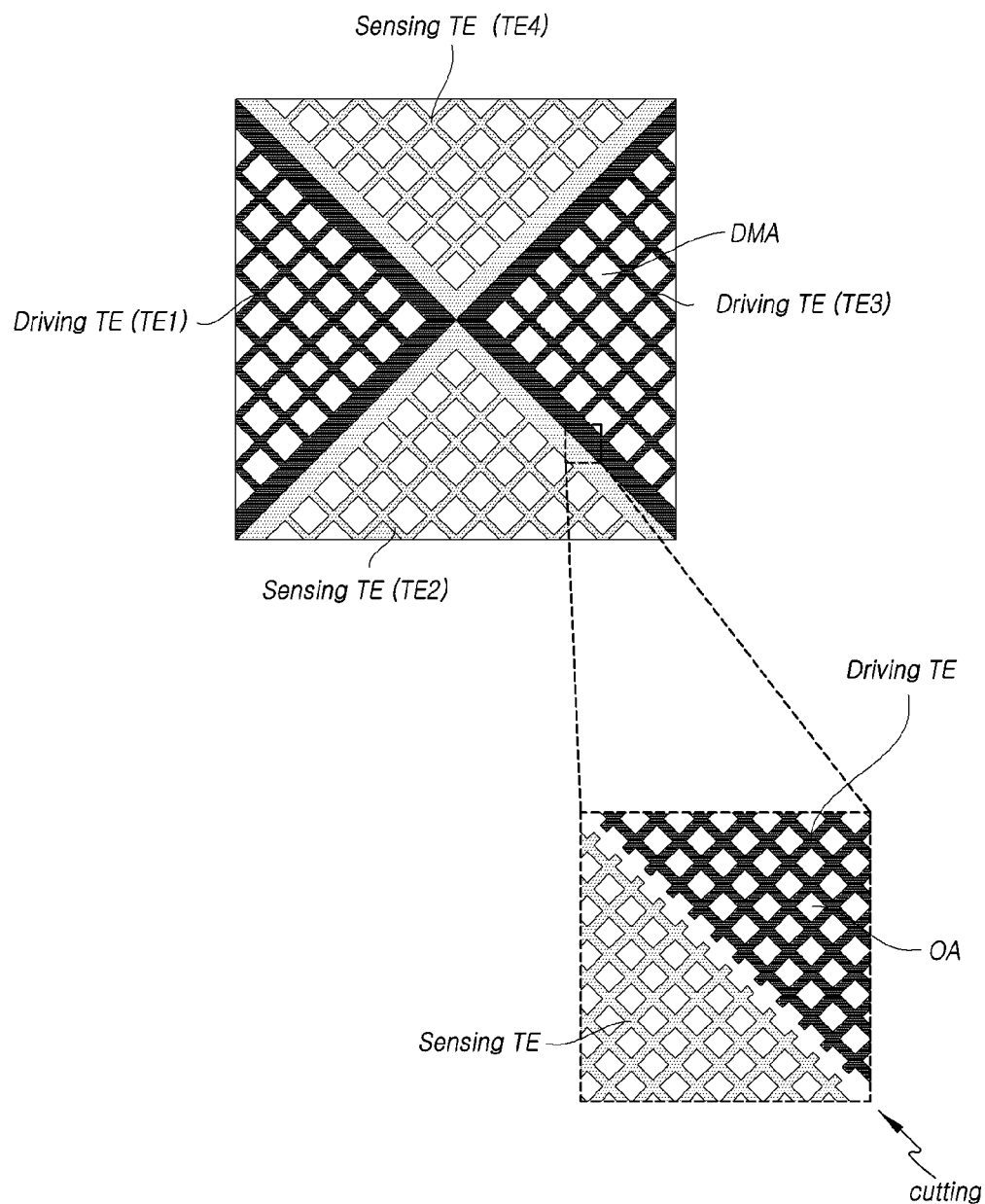
FIGS. 8 and 9 are diagrams illustrating an area in which a connection between two driving touch electrodes and a connection between two sensing touch electrodes are present, on a touch panel according to the present disclosure.
Figure 9:
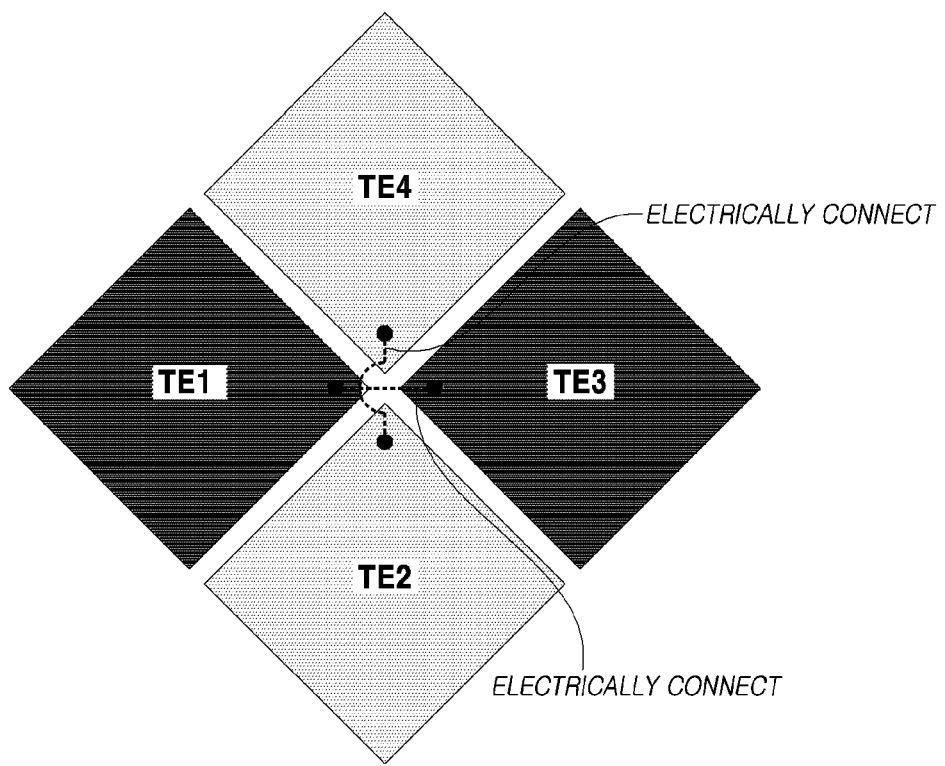

FIG. 8 is a diagram showing an area where a connection between two driving touching electrodes (driving TEs) and a connection between two sensing touching electrodes (sensing TEs) exists on a touch screen panel (TSP) according to present disclosure, which is shown as a dotted box portion of FIG. 2. FIG. 9 is a schematic diagram illustrating two driving touch electrodes (driving TEs) and two sensing touch electrodes (sensing TEs) in FIG. 8.

For convenience of description, a dummy metal (DM) present in a dummy metal area (DMA) is not displayed in the area of each of touch electrodes (TE1, TE2, TE3, and TE4) illustrated in FIG. 8 as shown in FIG. 7.

That is, in FIG. 8, a DM is present in the DMA, and an open area (OA) is present between the DM and the electrode metal (EM).

In FIG. 8, the OAs shown in an image obtained by enlarging the vicinity of a boundary between a third touch electrode TE3 corresponding to the driving TE and a second touch electrode TE2 corresponding to the sensing TE are not DMAs in which the DMs are present.

Referring to FIGS. 8 and 9, a first touch electrode (TE1) and a third touch electrode (TE3) corresponding to two driving TEs are electrically connected to each other to form a driving TE line.

Regarding the connection method, the TE1 and the TE3 corresponding to the two driving TEs may be electrically connected to each other through one or more bridges made of a conductive material, or may be integrated.

Referring to FIGS. 8 and 9, the TE2 and the TE4 corresponding to two sensing TEs are electrically connected to each other to form a sensing TE line.

Regarding the connection method, the TE2 and the TE4 corresponding to the two sensing TEs are electrically connected to each other through one or more bridges made of a conductive material, or may be integrated.

Meanwhile, referring to FIGS. 8 and 9, the TE1 and the TE3 corresponding to the driving TEs are arranged adjacent to each other in the row direction (or in the column direction), and are electrically connected to each other.

The TE2 and the TE4 corresponding to the sensing TEs are arranged adjacent to each other in the column direction (or in the row direction), and are electrically connected to each other.

The TE1, the TE2, the TE3, and the TE4 may be arranged in a rhombic shape (or diamond shape).

According to the arrangement and arrangement structure of the TEs, the driving TE line and the sensing TE line for mutual-capacitance-based touch sensing can be effectively produced.

Hereinafter, in the description of the bridge configuration, for convenience of description, the TE2 and the TE4 corresponding to the two sensing TEs are electrically connected to each other through a bridge configuration.

Figure 10:
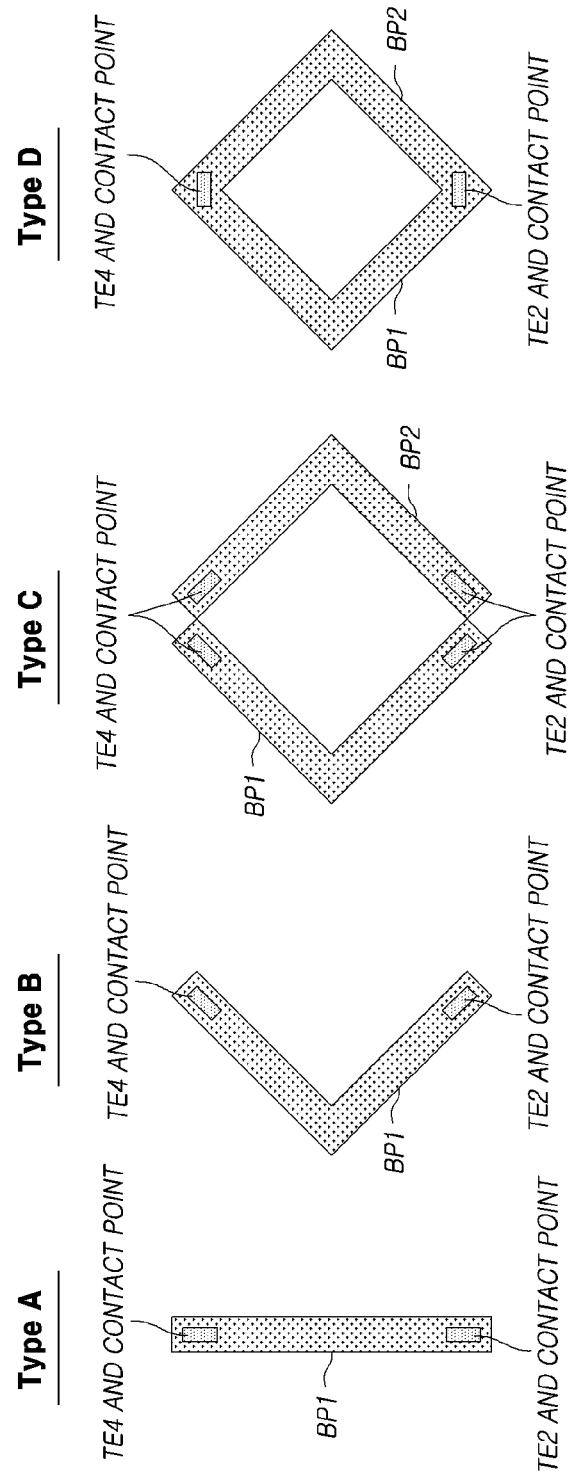
FIG. 10 is a diagram illustrating examples of a bridge configuration for a connection between touch electrodes on a touch panel according to the present disclosure.

FIG. 10 is a diagram illustrating examples of a bridge configuration for a connection between two touch electrodes (TE2 and TE4) on a touch screen panel (TSP) according to present disclosure.

The bridge configuration for the connection between the TE2 and TE4 may include one or more bridge patterns (BPs).

In the following description, when the bridge configuration includes only one BP, the one BP is referred to as a first bridge pattern (BP1).

When the bridge configuration includes two BPs, the two BPs are referred to as a BP1 and a second bridge pattern (BP2).

As in a type A, the bridge configuration may be composed of a bar-shaped BP1.

One end of the bar-shaped BP1 contacts an electrode metal (EM) of the TE2, and the other end thereof contacts an EM of the TE4.

Alternatively, as in a type B, the bridge configuration may be composed of a bent (or curved) BP1.

One end of the bent (or curved) BP1 contacts the EM of the TE2, and the other end thereof contacts the EM of the TE4.

Alternatively, as in a type C, the bridge configuration may be composed of bent (or curved) BP1 and BP2.

One end of the bent (or curved) BP1 contacts an EM of the TE2, and the other end thereof contacts an EM of the TE4.

One end of the bent (or curved) BP2 contacts the EM of the TE2, and the other end thereof contacts the EM of the TE4.

Alternatively, as in a type D, the bridge configuration may include one BP in the form of a rhombus.

In the type D, it can be seen that the BP1 and the BP2 are bent, but they are bent in the opposite direction to each other to obtain a rhombic form.

In addition, it can be seen that the type D is a modification of the type C, that is, is obtained by integrally forming the BP1 and the BP2.

It can be seen that a contact point of the BP1 with the TE2 in the type C and a contact point of the BP2 with the TE2 coincide with each other in the type D, and a contact point of the BP1 with the TE4 and a contact point of the BP2 with the TE4 coincide with each other in the type C.

The BP1 and BP2 for an electrical connection between the TE2 and TE4 may be present in a bridge layer which is different from a TE layer where the TEs are formed.

The TE layer and the bridge layer are separated by an insulating layer. Thus, each of the TE2 and TE4 is connected to a corresponding BP through a contact hole of the insulating layer.

Hereinafter, for convenience of description, the TE1 and the TE3 corresponding to two driving TEs are integrally formed and electrically connected, and the TE2 and the TE4 corresponding to two sensing TEs are electrically connected to each other through a bridge configuration.

Figure 11:
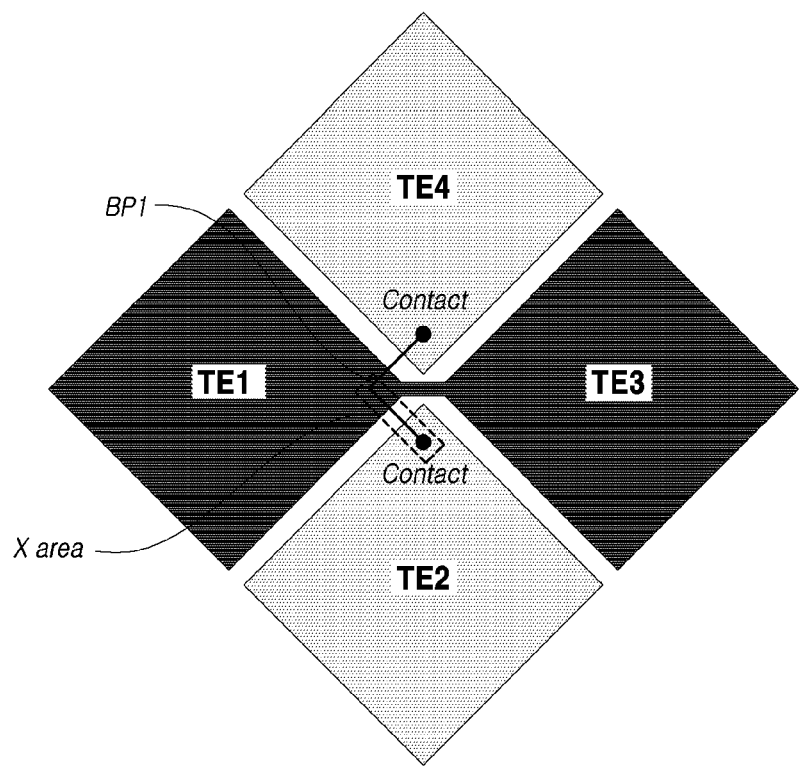
FIG. 11 is a diagram illustrating a case in which two driving touch electrodes (first touch electrode and third touch electrode) are connected in an integrated manner and two sensing touch electrodes (second touch electrode and fourth touch electrode) are connected through one bridge in a touch panel according to the present disclosure.

FIG. 11 is a diagram illustrating a case in which two driving TEs (TE1 and TE3) are connected to each other in an integrated manner and two sensing TEs (TE2 and TE4) are connected to each other through one BP1, on a touch screen panel (TSP) according to present disclosure.

Referring to FIG. 11, the TE1 and the TE3 corresponding to the two driving TEs may be connected to each other in an integrated manner.

That is, an electrode metal (EM) in an area of the TE1 and an EM in an area of the TE3 are integrally connected to each other.

Referring to FIG. 11, the TE2 and the TE4 corresponding to the two sensing TEs may be connected to each other through one bent BP1, as in the type B.

Figure 12:
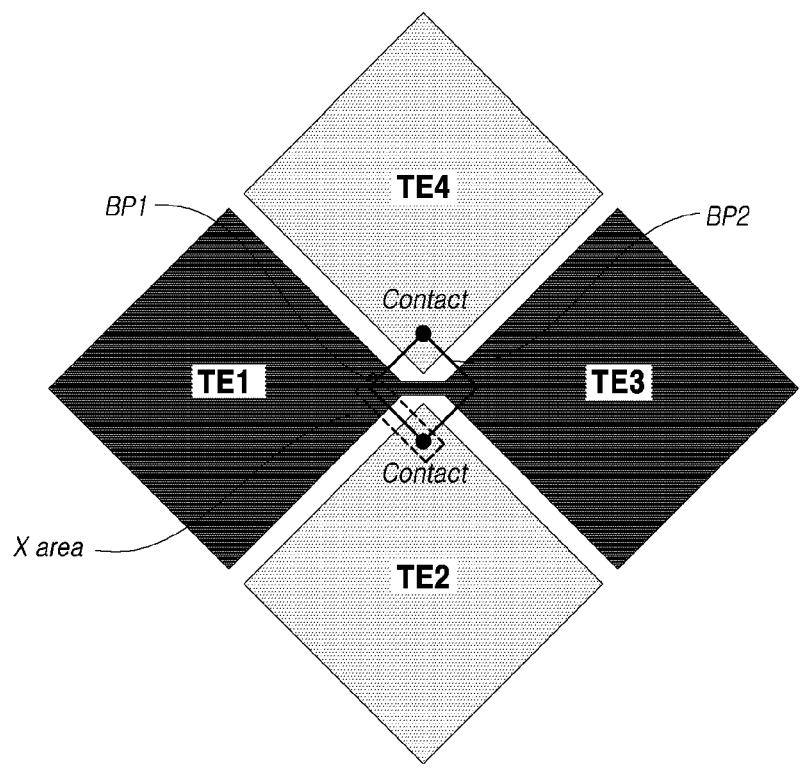
FIG. 12 is a diagram illustrating a case in which two driving touch electrodes (first touch electrode and third touch electrode) are connected in an integrated manner and two sensing touch electrodes (second touch electrode and fourth touch electrode) are connected through two bridges in a touch panel according to the present disclosure.
Figure 12:
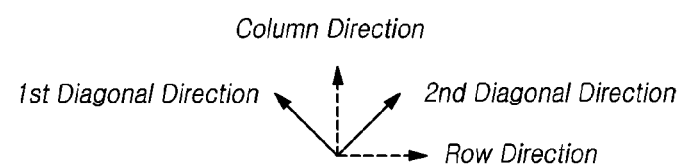

FIG. 12 is a diagram illustrating a case in which two driving TEs (TE1 and TE3) are connected to each other in an integrated manner and two sensing TEs (TE2 and TE4) are connected to each other through BP1 and BP2, on a touch screen panel (TSP) according to present disclosure.

Referring to FIG. 12, the TE1 and the TE3 corresponding to the two driving TEs may be connected to each other in an integrated manner.

That is, an electrode metal (EM) in an area of the TE1 and an EM in an area of the TE3 are integrally connected to each other.

Referring to FIG. 12, the TE2 and the TE4 corresponding to the two sensing TEs may be connected to each other through two rhombic BP1 and BP2 as in the type D (which may be regarded as the type C). Here, the BP1 and BP2 may be separate patterns or an integrated pattern.

In FIGS. 11 and 12, the TE1 and the TE3 corresponding to the two driving TEs are integrated and electrically connected to each other. However, as in the connection method between the two sensing TEs, the TE1 and the TE3 corresponding to the two driving TEs may be electrically connected to each other by another bridge present in a bridge layer.

As described above, when the connection for forming the sensing TE line is performed in an integrated manner, there is no need to use an additional connection configuration (bridge), which is advantageous in that the process is easy and the electrical connection is excellent.

Hereinafter, the structure of the BP1 indicated by the dotted box in FIGS. 11 and 12 will be described in more detail with reference to FIGS. 13 to 16.

Figure 13:
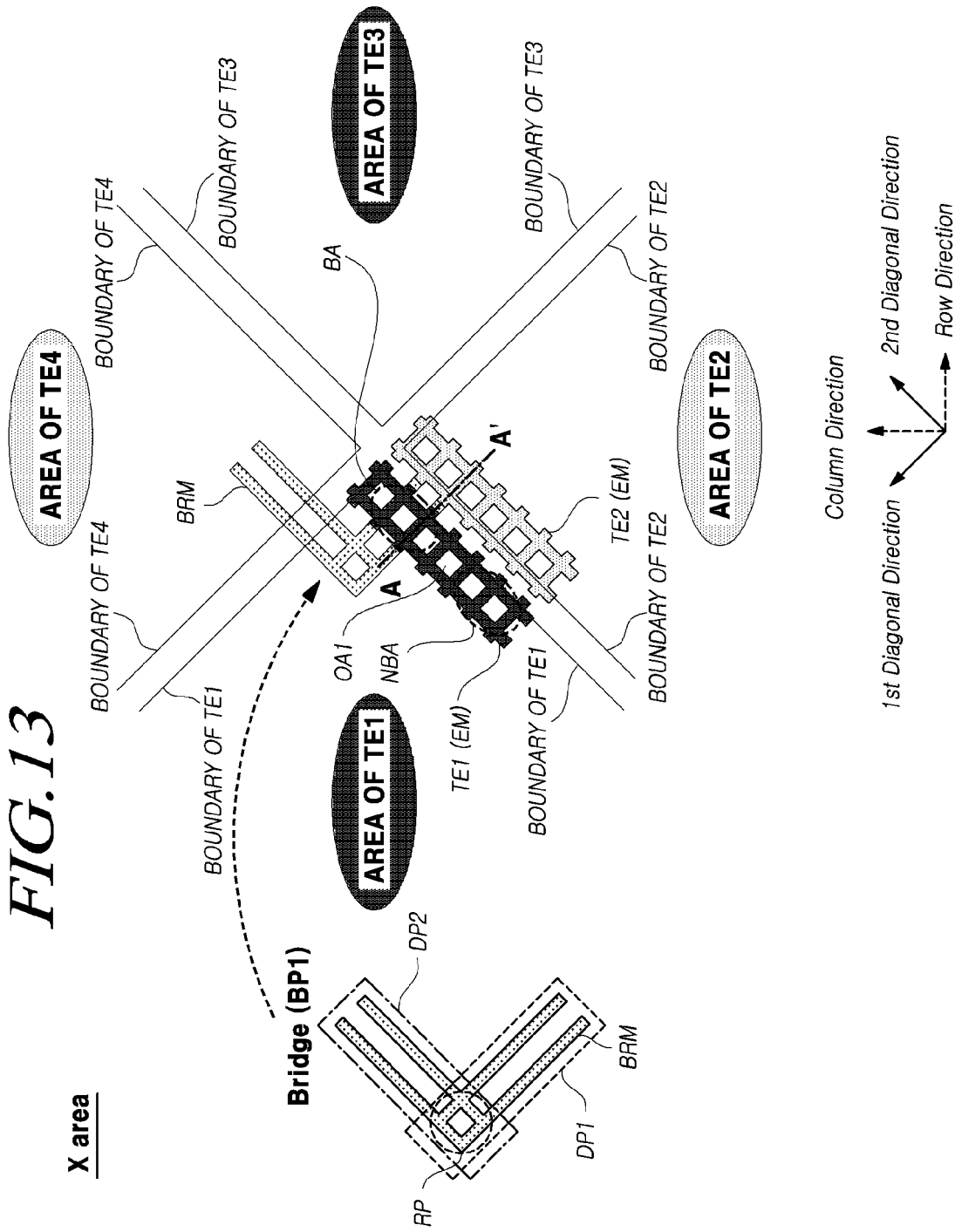
FIG. 13 is a diagram illustrating an example of a structure in which two sensing touch electrodes (second touch electrode and fourth touch electrode) are connected through a first bridge in a touch panel according to the present disclosure.
Figure 14:
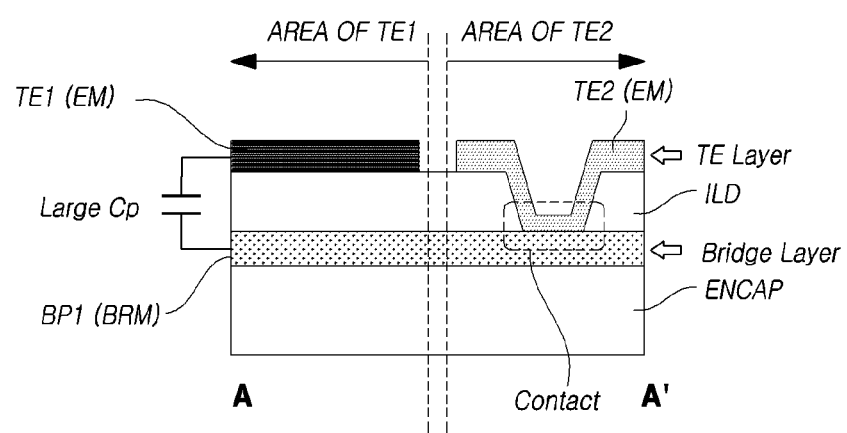
FIG. 14 is a cross-sectional view taken along line AA' in FIG. 13.

FIG. 13 is a diagram illustrating an example of a structure in which two sensing TEs (TE2 and TE4) are connected to each other through a first bridge pattern (BP1) on a touch screen panel (TSP) according to present disclosure. FIG. 14 is a cross-sectional view taken along line AA' in FIG. 13.

The TE2 and the TE4 are electrically connected to each other through the BP1 present in a bridge layer.

As shown in FIG. 14, the bridge layer is separated from a TE layer in which TEs are present, by an insulating layer.

As shown in FIGS. 13 and 14, one end of the BP1 contacts the TE2 in an area of the TE2.

The other end of the BP1 contacts the TE4 in the same way that the one end of the BP1 contacts the TE2.

As shown in FIGS. 13 and 14, a portion between the one end and the other end of the BP1 may pass through an area of the TEL Meanwhile, on each of the TE1, the TE2, the TE3, and the TE4, an EM is patterned in the form of a mesh having rhombic holes.

As shown in FIG. 13, the BP1 is bent at a portion passing through the area of the TE1.

The BP1 includes a first diagonal portion (DP1) in a first diagonal direction and a second diagonal portion (DP2) in a second diagonal direction with respect to the bent point.

The DP1 and the DP2 at the BP1 are respectively parallel to a first side and a second side among four sides of a rhombic hole (OA1, open area) of an EM corresponding to the TE1.

As described above, the BP1 for connecting the TE2 and the TE4 passes through the area of the TE1 to connect the TE2 and the TE4 without affecting the connection structure between the TE1 and the TE3.

In addition, a bridge metal pattern of a portion where the BP1 for connecting the TE2 and the TE4 passes through the area of the TE1 and an electrode metal pattern of the TE1 are designed to correspond to each other so that the BP1 and the TE1 may be formed in the same patterning method, thereby facilitating the process.

Meanwhile, the BP1 may be a multi-line bridge metal (BRM).

As described above, by forming the BP1 as the multi-line BRM, resistance on an electrical connection between the TE2 and the TE4 is reduced, thereby achieving an excellent electrical connection. That is, an accurate touch sensing signal can be stably detected through a sensing TE line including the electrical connection between the TE2 and the TE4. When a driving TE line is formed through the electrical connection between the TE2 and the TE4, an accurate touch driving signal can be stably applied to the TE2 and the TE4.

The BP1 may be a BRM, and may have a portion (RP) patterned in the form of a mesh.

As described above, since the BP1 is the BRM and has the RP patterned in the form of a mesh, resistance of an electrical connection between the TE2 and the TE4 is reduced, thereby achieving an excellent electrical connection. That is, an accurate touch sensing signal can be stably detected through a sensing TE line including the electrical connection between the TE2 and the TE4. When a driving TE line is formed through the electrical connection between the TE2 and the TE4, an accurate touch driving signal can be stably applied to the TE2 and the TE4.

The bridge metal pattern of the BP1 may include the same portion as the electrode metal pattern of the TE. That is, the RP patterned in the form of a mesh in the BP1 is the same as the electrode metal pattern of the TE.

As described above, the bridge metal pattern of the BP1 for connecting the TE2 and the TE4 and the electrode metal pattern of the TE1 are designed to be the same so that the BP1 and the TE1 can be formed in the same patterning method, thereby facilitating the process.

Meanwhile, when the TE2 and the TE4 are electrically connected to each other as the bridge configuration of the type C or type D shown in FIG. 10, the BP2 having the same structure and arrangement as those of the BP1 which have been described with reference to FIGS. 13 and 14 may further connect the TE2 and the TE4.

Accordingly, the TE2 and the TE4 may be electrically connected to each other through even the BP2 in addition to the BP1 present in the bridge layer separated from the touch electrode layer by an insulating layer.

However, the BP2 has a symmetrical structure with the BP1.

Accordingly, the BP2 passes through the area of the TE3.

The electrode metal pattern of the TE3 at the area through which the BP2 passes is the same as the electrode metal pattern of the TE3 at the area through which the BP2 does not pass.

Accordingly, the BP2 also forms significantly large unnecessary capacitance with the TE3.

Meanwhile, as described above, the BP1 and the BP2 may be separate from each other or may be integrated.

In this regard, the BP1 and the BP2 may be formed in a separate pattern or may be integrally formed, depending on an appropriate position or number of contact points between the bridge-touch electrodes.

As shown in FIG. 14, the bridge layer may be located below the touch electrode layer.

In some cases, the bridge layer may be located above the touch electrode layer.

As described above, the TEs may be formed above or below the BP so as to be suitable for the peripheral structure of the TSP.

As described above, the TE1 and the TE3 may be the driving TEs forming the driving TE line, and the TE2 and the TE4 may be the sensing TEs forming the sensing TE line.

That is, the touch circuit 130 supplies the touch driving signal to the TE1 and the TE3 included in the driving TE line, and detects the touch sensing signal from the TE2 and the TE4 included in the sensing TE line.

On the other hand, the TE1 and the TE3 may be the sensing TEs forming the sensing TE line, and the TE2 and the TE4 may be the driving TEs forming the driving TE line.

That is, the touch circuit 130 supplies the touch driving signal to the TE2 and the TE4 included in the driving TE line, and detects the touch sensing signal from the TE1 and the TE3 included in the sensing TE line.

As described above, the TSP may be manufactured in a method of forming the driving TE line in the row direction and the sensing TE line in the column direction (shown in FIG. 2) or may be manufactured in a method of forming the driving TE line in the column direction and the sensing TE line in the row direction, so that it is possible to provide the TSP suitable for the type, size, or design of the touch display device 100.

Meanwhile, referring to FIG. 13, the BP1 passes through the area of the TE1, and the electrode metal pattern of the TE1 in an area (BA) of the TE1 through which the BP1 passes is the same as the electrode metal pattern of the TE1 in an area (NBA) of the TE1 through which the BP1 does not pass.

The BRM corresponding to a first diagonal portion (DP1) in the BP1 and an electrode metal (EM) patterned in the first diagonal direction in the TE1 overlap each other to be long.

Accordingly, significantly large unnecessary mutual-capacitance Cp may be formed between the BRM of the BP1 and the EM of the TE1.

This unnecessary mutual-capacitance Cp is a kind of parasitic capacitance, which can be a factor that greatly decreases the touch sensitivity.

Hereinafter, a structure and a method for reducing undesired unnecessary mutual-capacitance Cp will be described with reference to FIGS. 15 and 16. However, the description of the same contents as those of FIGS. 13 and 14 will be omitted.

Figure 15:
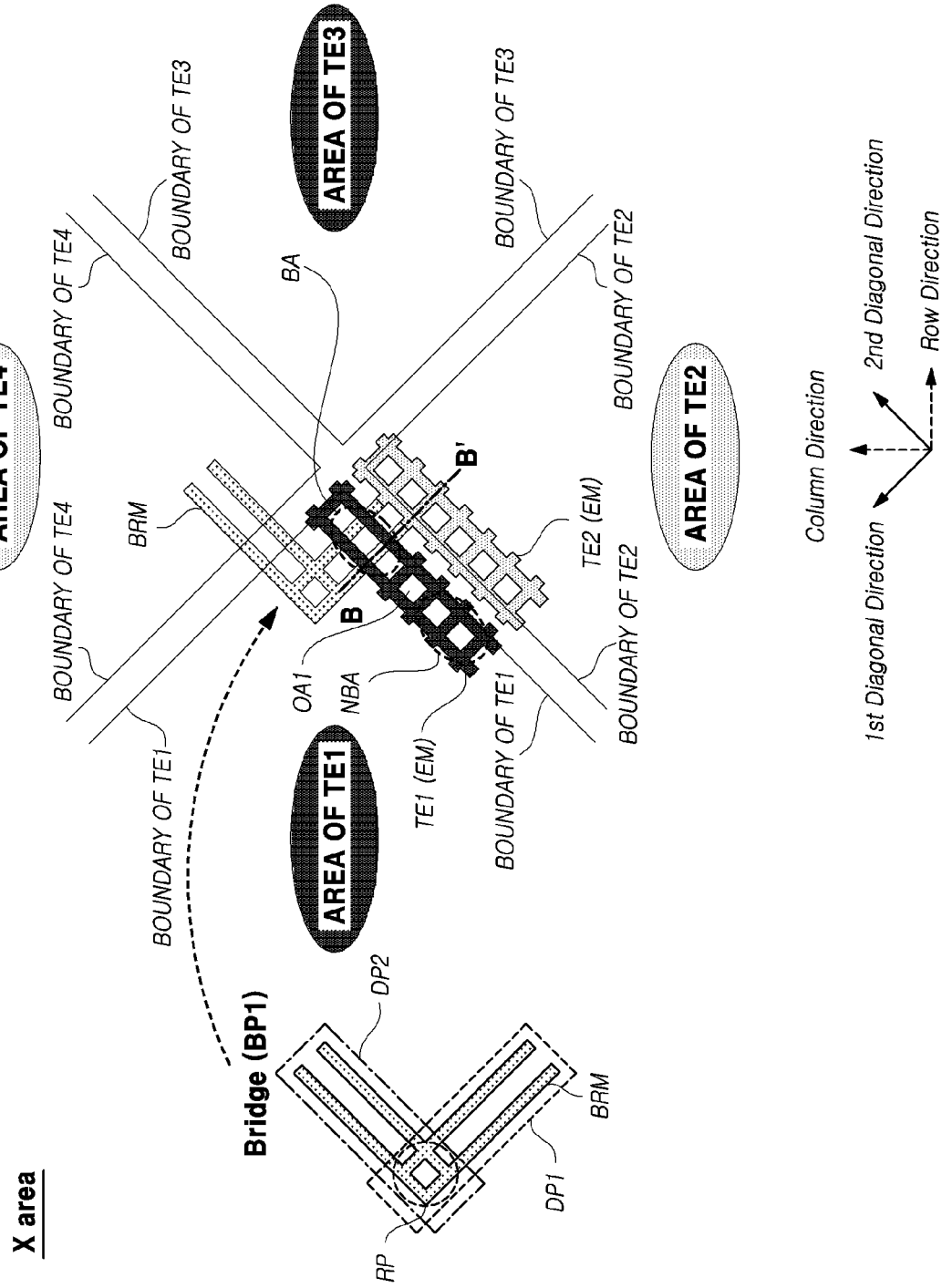
FIG. 15 is a diagram illustrating another example of a structure in which two sensing touch electrodes (second touch electrode and fourth touch electrode) are connected through a first bridge on a touch panel according to the present disclosure.
Figure 16:
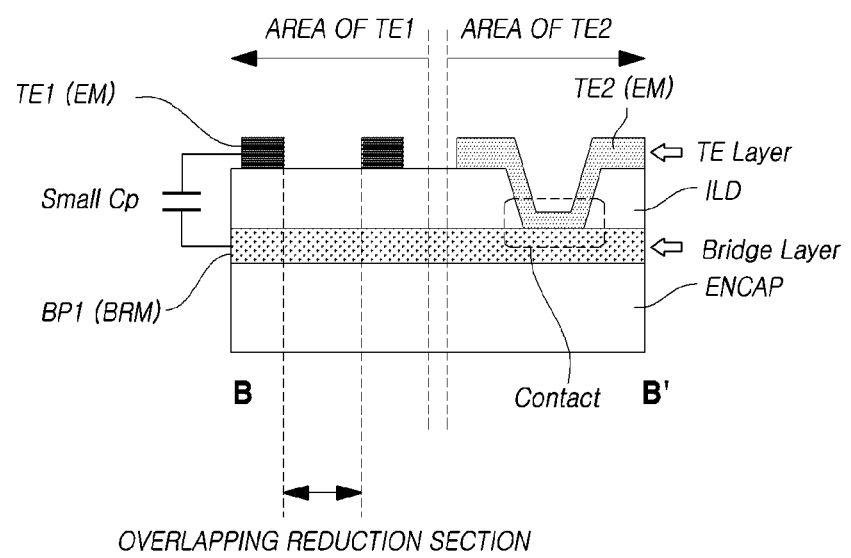
FIG. 16 is a cross-sectional view taken along line BB' of FIG. 15.

FIG. 15 is a diagram illustrating another example of a structure in which two sensing TEs (TE2 and TE4) are connected to each other through a first bridge pattern (BP1) on a touch screen panel (TSP) according to aspects, and FIG. 16 is a cross-sectional view taken along a line BB' of FIG. 15.

Referring to FIG. 15, an electrode metal pattern of the TE1 in an area (BA) of the TE1 through which the BP1 passes and an electrode metal pattern of the TE1 in an area (NBA) of the TE1 through which the BP1 does not pass may be different from each other.

Accordingly, an overlapping area between the BP1 and an electrode metal (EM) of the TE1 in the BA through which the BP1 passes and an overlapping area between the BP1 and the EM of the TE1 in the NBA through which the BP1 does not pass may be made different.

In the BA through which the BP1 passes, an EM pattern of the TE1 may be a pattern in which the EM patterned in the same direction (that is, a first diagonal direction) as the direction of the BP1 is not present.

In the NBA through which the BP1 does not pass, the EM pattern of the TE1 may be a pattern in which the EM patterned in the same direction (that is, the first diagonal direction) as the direction of the BP1 is present.

Accordingly, as shown in FIG. 16, a section where the BRM corresponding to the DP1 in the BP1 and the EM patterned in the first diagonal direction in the TE1 overlap each other can be significantly reduced. That is, the overlapping area between the BRM of the BP1 and the EM of the TE1 can be reduced.

Thus, as compared with the bridge structure of FIGS. 13 and 14, unnecessary mutual-capacitance Cp between the BRM of the BP1 and the EM of the TE1 according to the bridge structure of FIGS. 15 and 16 can be significantly reduced.

This reduction in the unnecessary mutual-capacitance Cp can improve the touch sensitivity, as compared with the bridge structure of FIGS. 13 and 14.

In the same manner as the structure and arrangement of the BP1 shown in FIGS. 15 and 16, a BP2 may be further present for an additional connection between the TE2 and the TE4.

That is, the TE2 and the TE4 may be electrically connected to each other through even the BP2 in addition to the BP1 present in the bridge layer separated from the touch electrode layer by an insulating layer.

However, only the arrangements of the BP1 and the BP2 are symmetrical to each other. That is, the BP2 passes through an area of the TE3.

In addition, in the same manner as in the BP1, the electrode metal pattern of the TE3 in an area through which the BP2 passes and the electrode metal pattern of the TE3 in an area through which the BP2 does not pass may be different from each other.

In the area through which the BP2 passes, the electrode metal pattern of the TE3 may be a pattern in which an EM patterned in the same direction (that is, a second diagonal direction) as the direction of the BP2 is not present.

In the area through which the BP2 does not pass, the electrode metal pattern of the TE3 may be a pattern in which the EM patterned in the same direction (that is, the second diagonal direction) as the direction of the BP2 is present.

Accordingly, although the BP2 is added, the unnecessary capacitance can be reduced. That is, an overlapping area between the BRM of the added BP2 and the EM of the TE3 can be reduced.

Thus, as compared with the bridge structures of FIGS. 13 and 14, the unnecessary mutual-capacitance Cp between the BRM of the BP2 and the EM of the TE3 according to the bridge structures of FIGS. 15 and 16 can be significantly reduced.

This reduction in the unnecessary mutual-capacitance Cp can improve the touch sensitivity, as compared with the bridge structures of FIGS. 13 and 14.

Figure 17:
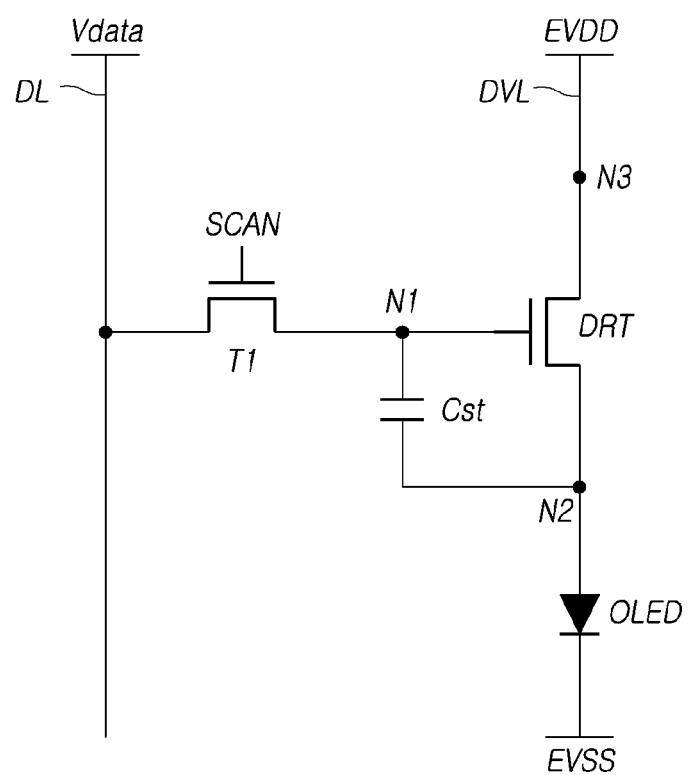
FIGS. 17 and 18 illustrate structures of subpixels of a touch display device according to the present disclosure.
Figure 18:
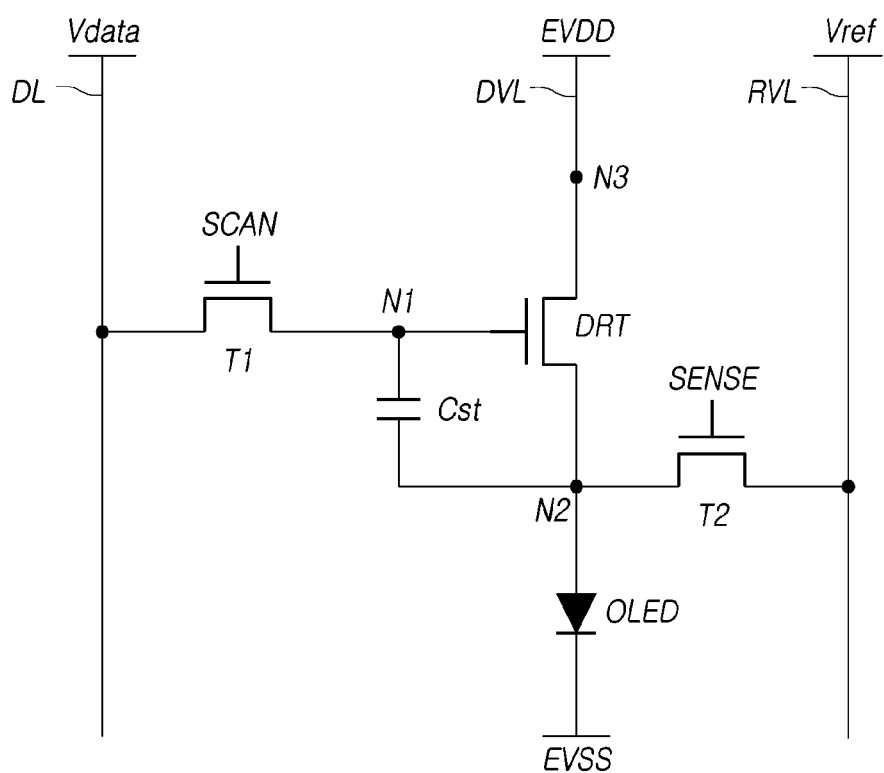

FIGS. 17 and 18 illustrate examples of structures of subpixels of the touch display device 100 according to present disclosure.

Referring to FIG. 17, in the case where the touch display device 100 according to present disclosure is an organic light emitting display, each subpixel basically includes an organic light emitting diode (OLED), a driving transistor DRT for driving the OLED, a first transistor T1 for transmitting a data voltage to a first node N1 corresponding to a gate node of the driving transistor DRT, and a storage capacitor Cst for maintaining a data voltage corresponding to an image signal voltage or a voltage thereto for one frame time.

The OLED may include a first electrode (e.g., an anode electrode or a cathode electrode), an organic layer, and a second electrode (e.g., a cathode electrode or an anode electrode).

A base voltage EVSS may be applied to the second electrode of the OLED.

The driving transistor DRT drives the OLED by supplying a driving current to the OLED.

The driving transistor DRT has a first node N1, a second node N2, and a third node N3.

The first node N1 of the driving transistor DRT is a node corresponding to a gate node and may be electrically connected to a source node or a drain node of the first transistor T1.

The second node N2 of the driving transistor DRT may be electrically connected to the first electrode of the OLED and may be a source node or a drain node.

The third node N3 of the driving transistor DRT may be a node to which a driving voltage EVDD is applied, may be electrically connected to a driving voltage line DVL supplying the driving voltage EVDD, and may be a drain node or a source node.

The first transistor T1 is electrically connected between the data line DL and the first node N1 of the driving transistor DRT and receives a scanning signal SCAN to the gate node through a gate line to be controlled.

The first transistor T1 may be turned on by the scanning signal SCAN to transmit the data voltage Vdata supplied from the data line DL to the first node N1 of the driving transistor DRT.

The storage capacitor Cst may be electrically connected between the first node N1 and the second node N2 of the driving transistor DRT.

The storage capacitor Cst is not a parasitic capacitor (for example, Cgs or Cgd) which is an internal capacitor existing between the first node N1 and the second node N2 of the driving transistor DRT, and is an external capacitor intentionally designed outside the driving transistor DRT.

Meanwhile, in order to control the voltage of the second node N2 of the driving transistor DRT or to sense a characteristic value of the subpixel (e.g., a threshold voltage or mobility of the driving transistor DRT, a threshold voltage of the OLED, etc.), each subpixel may further include a second transistor T2 as shown in FIG. 18.

The second transistor T2 is electrically connected between the second node N2 of the driving transistor DRT and a reference voltage line RVL for supplying a reference voltage Vref, and receives a sensing signal SENSE, which is a kind of the scanning signal, to the gate node to be controlled.

The second transistor T2 is turned on by the sensing signal SENSE to apply the reference voltage Vref supplied through the reference voltage line RVL to the second node N2 of the driving transistor DRT.

In addition, the second transistor T2 may be utilized as one of voltage sensing paths for the second node N2 of the driving transistor DRT.

Meanwhile, the scanning signal SCAN and the sensing signal SENSE may be separate gate signals. In this case, the scanning signal SCAN and the sensing signal SENSE may be respectively applied to the gate node of the first transistor T1 and the gate node of the second transistor T2 through different gate lines.

In some cases, the scanning signal SCAN and the sensing signal SENSE may be the same gate signal. In this case, the scanning signal SCAN and the sensing signal SENSE may be commonly applied to the gate node of the first transistor T1 and the gate node of the second transistor T2 through the same gate line.

Each of the driving transistor DRT, the first transistor T1, and the second transistor T2 may be an n-type transistor or a p-type transistor.

Figure 19:
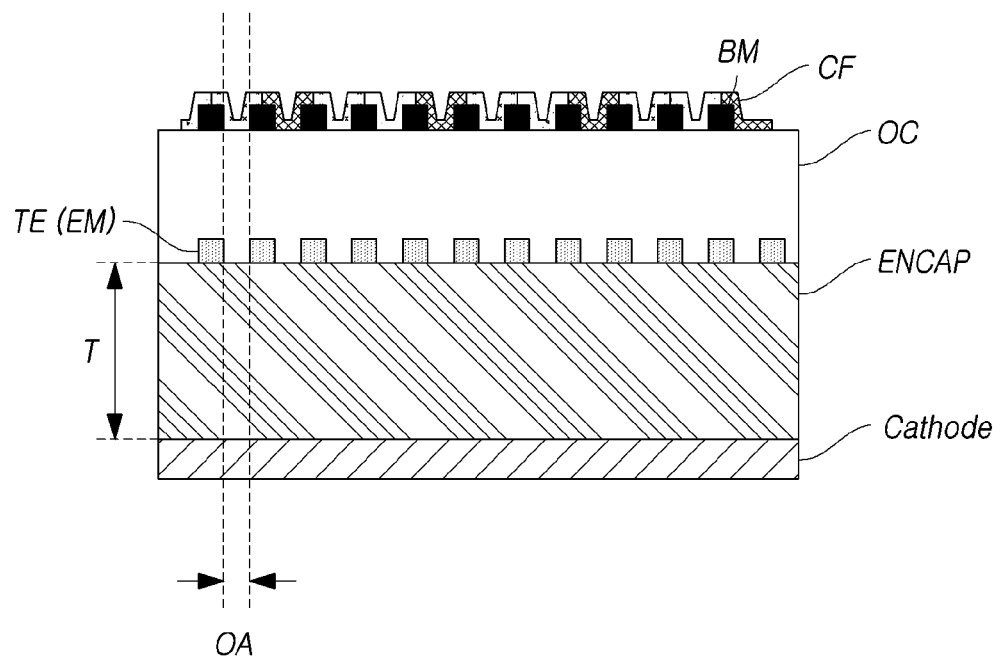
FIGS. 19 and 20 are cross-sectional views of a touch display device according to the present disclosure.
Figure 20:
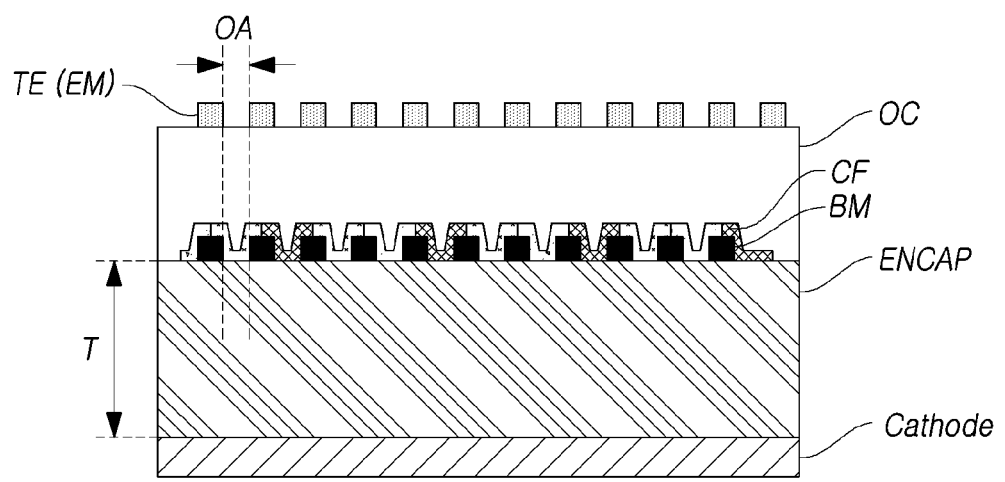

FIGS. 19 and 20 are cross-sectional views of the touch display device 100 of the present disclosure.

Referring to FIGS. 19 and 20, when a touch screen panel (TSP) is embedded in the display panel 110 implemented as an organic light emitting display panel, the TSP may be located on an encapsulation layer ENCAP. In other words, a touch sensor metal such as a plurality of touch electrodes (TEs), a plurality of touch lines (TLs), or the like may be located on the encapsulation layer ENCAP.

As described above, by forming the TEs on the encapsulation layer ENCAP, the TE may be formed without greatly affecting display performance and formation of a layer for display.

In FIGS. 19 and 20, for convenience of description, an insulating layer (ILD) and a bridge pattern (BP) are omitted.

Meanwhile, referring to FIGS. 19 and 20, a cathode of the OLED may be present under the encapsulation layer ENCAP.

The thickness T of the encapsulation layer ENCAP may be, for example, 5 micrometers or more.

As described above, a parasitic capacitance formed between the cathode of the OLED and the TEs can be reduced by designing the thickness of the encapsulation layer ENCAP to be 5 micrometers or more. Thus, it is possible to prevent a decrease in the touch sensitivity due to the parasitic capacitance.

Meanwhile, as to each of the plurality of TEs, an electrode metal (EM) is patterned in the form of a mesh having a plurality of open areas OAs. In the plurality of open areas OAs, one or more subpixels or a light emitting portion thereof may be present when viewed in the vertical direction.

As described above, when seen from a plan view, the EM of the TE is patterned in such a manner that the light emitting portions of the one or more subpixels correspond to the respective positions of the open areas OAs existing in the area of the TE, thereby increasing the luminous efficiency of the display panel 110.

Accordingly, as shown in FIGS. 19 and 20, the position of a black matrix (BM) corresponds to the position of the EM of the TEs.

The positions of a plurality of color filters (CFs) correspond to the positions of the plurality of TEs.

As described above, since the plurality of CFs is located at positions corresponding to the positions of the plurality of OAs, it is possible to provide the touch display device 100 having excellent light emitting performance when using an organic light emitting display panel (in particular, a white OLED).

The vertical positional relationship between the CFs and the TEs will now be described.

As shown in FIG. 19, the plurality of CFs and the BM may be located above the plurality of TEs.

The plurality of CFs and the BM may be located on an overcoat layer OC above the plurality of TEs.

As shown in FIG. 20, the plurality of CFs and the BM may be located below the plurality of TEs.

The plurality of TEs may be located on the overcoat layer OC above the plurality of CFs and the BM.

As described above, the touch display device 100 having an optimal positional relationship between the CFs and the TEs may be provided in consideration of the display performance such as light emitting performance and the touch performance.

Meanwhile, attempts to mount the TSP composed of the TEs in the display panel 110 have been made in order to improve manufacturing convenience and size reduction of the touch display device 100.

However, in order to mount the TSP in the display panel 110, which is an organic light emitting display panel, there are considerable difficulties and many limitations.

For example, during the manufacturing process of the display panel 110, which is an organic light emitting display panel, there is a limitation in that a high-temperature process for forming the TEs, which are generally made of a metal material, in the panel is not freely performed due to organic materials.

Due to restriction factors such as the structural characteristics and process of such an organic light emitting display panel, it is difficult to arrange the TEs as the touch sensor in the display panel 110, which is the organic light emitting display panel. Accordingly, in the prior art, a touch structure has been implemented by attaching the TSP on the display panel 110 which is the organic light emitting display panel, instead of mounting the TSP in the display panel 110 which is the organic light emitting display panel.

However, as shown in FIGS. 19 and 20, it is possible to provide the display panel 110, which is the organic light emitting display panel, in which the TSP having excellent display performance and touch performance is mounted, through a structure in which the TEs are formed on the encapsulation layer ENCAP.

According to the present disclosure described above, it is possible to provide the touch display device 100 and the TSP which can prevent large unnecessary and undesired capacitance and thereby obtain excellent touch sensitivity.

In addition, according to the present disclosure, it is possible to provide the touch display device 100 and the TSP which can prevent large unnecessary and undesired capacitance between the BP for the electrical connection between the TEs and the surrounding TEs and thereby obtain excellent touch sensitivity.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A touch display device comprising:
   a touch panel in which a plurality of touch electrodes is arranged on a touch electrode layer; and
   a touch circuit driving the touch panel and sensing presence or absence of a touch or a touch position,
   wherein the plurality of touch electrodes is disposed to have a first mesh form, and each of the plurality of touch electrodes includes an electrode metal pattern to have a second mesh form shaped by first and second line patterns crossing each other and a plurality of openings formed by the second mesh form, the plurality of touch electrodes includes a first touch electrode, a second touch electrode, a third touch electrode, and a fourth touch electrode,
   the first touch electrode and the third touch electrode are electrically connected to each other, and the second touch electrode and the fourth touch electrode are electrically connected to each other,
   the second touch electrode and the fourth touch electrode are electrically connected to each other through a first bridge in a bridge layer which is a different layer from the touch electrode layer,
   the first bridge passes through a first area of the first touch electrode,
   the electrode metal pattern of the first touch electrode is absent in the same direction as a direction of the first bridge in the first area through which the first bridge passes,
   wherein the second mesh form includes a dummy metal pattern or a dummy space disposed within the second mesh form, wherein the dummy metal pattern is disconnected within the second mesh form, and
   wherein one of the first and second line patterns of the electrode metal pattern crossing each other of the first touch electrode is absent in an area overlapping with the pattern of the first bridge in the same direction as the direction of the first bridge in the first area and extends in the direction of the first bridge in an area except for the overlapping area, and the other of the first and second line patterns extends by crossing the pattern of the first bridge in the first area.

2. The touch display device of claim 1, wherein the electrode metal pattern of the first touch electrode is present in the same direction as the direction of the first bridge in a second area through which the first bridge does not pass.

3. The touch display device of claim 1, wherein
   the first touch electrode and the third touch electrode are adjacent to each other in a row direction or a column direction, and the second touch electrode and the fourth touch electrode are adjacent to each other in the column direction or the row direction, and
   the first touch electrode, the second touch electrode, the third touch electrode, and the fourth touch electrode are arranged in a rhombic shape.

4. The touch display device of claim 1, wherein
   the second mesh form of the electrode metal pattern has a rhombic hole,
   the first bridge is bent at a portion thereof passing through the first area of the first touch electrode, and includes a first diagonal portion in a first diagonal direction and a second diagonal portion in a second diagonal direction with respect to the bent point, and
   the first diagonal portion and the second diagonal portion in the first bridge are parallel to a first side and a second side, respectively among four sides of the rhombic hole of the electrode metal pattern of the first touch electrode.

5. The touch display device of claim 1, wherein the first bridge is a multi-line bridge metal.

6. The touch display device of claim 1, wherein the first bridge includes a portion of the electrode metal pattern having the second mesh form.

7. The touch display device of claim 1, wherein the first bridge includes a same portion as the electrode metal pattern of the touch electrodes.

8. The touch display device of claim 1, further comprising:
   a second bridge for an additional electrical connection between the second touch electrode and the fourth touch electrode, wherein the second bridge has a shape symmetrical to the first bridge,
   the second bridge passes through an area of the third touch electrode, and
   an electrode metal pattern of the third touch electrode is absent in the same direction as a direction of the second bridge in the area through which the second bridge passes.

9. The touch display device of claim 8, wherein the first bridge and the second bridge are separated from each other or integrated with each other.

10. The touch display device of claim 1, wherein the first touch electrode and the third touch electrode are integrated and electrically connected with each other.

11. The touch display device of claim 1, wherein the bridge layer is located below the touch electrode layer.

12. The touch display device of claim 1, wherein the bridge layer is located above the touch electrode layer.

13. The touch display device of claim 1, wherein the touch circuit
    supplies a touch driving signal to the first touch electrode and the third touch electrode, and
    detects a touch sensing signal from the second touch electrode and the fourth touch electrode.

14. The touch display device of claim 1, wherein the touch circuit
    supplies a touch driving signal to the second touch electrode and the fourth touch electrode, and
    detects a touch sensing signal from the first touch electrode and the third touch electrode.

15. The touch display device of claim 1, wherein the plurality of touch electrode and the dummy metal pattern are formed of a same material.

16. The touch display device of claim 1, wherein the dummy space corresponds to a light emitting portion of one or more subpixels on the display panel.

17. The touch display device of claim 1, wherein the dummy space is greater than a size of each opening of the second mesh form to adjust capacitance of the plurality of touch electrode.

18. A touch panel comprising:
    a first touch electrode;
    a second touch electrode adjacent to the first touch electrode;
    a third touch electrode electrically connected to the first touch electrode;
    a fourth touch electrode electrically connected to the second touch electrode; and a first bridge electrically connecting the second touch electrode and the fourth touch electrode and present in a bridge layer different from a touch electrode layer, wherein the first, second third and fourth touch electrodes are disposed to have a first mesh form, and each of the first touch electrode, the second touch electrode, the third touch electrode, and the fourth touch electrode includes an electrode metal pattern having a second mesh form shaped by first and second line patterns crossing each other and a plurality of openings formed by the second mesh form, and the first bridge passes through an area of the first touch electrode;

a first electrode metal pattern of the first touch electrode in a first area through which the first bridge passes is different from a second electrode metal pattern of the first touch electrode in a second area through which the first bridge does not pass, wherein the second mesh form includes a dummy metal pattern or a dummy space disposed within the second mesh form, wherein the dummy metal pattern is disconnected within the second mesh form, and wherein one of the first and second line patterns of the electrode metal pattern crossing each other of the first touch electrode is absent in an area overlapping with the pattern of the first bridge in the same direction as the direction of the first bridge in the first area and extends in the direction of the first bridge in an area except for the overlapping area, and the other of the first and second line patterns extends by crossing the pattern of the first bridge in the first area.

19. The touch panel of claim 18, wherein the first electrode metal pattern of the first touch electrode is absent in the same direction as a direction of the first bridge in the first area through which the first bridge passes, and the second electrode metal pattern of the first touch electrode is present in the same direction as a direction of the first bridge in the second area through which the first bridge does not pass.

20. The touch panel of claim 18, further comprising:

a second bridge for an additional electrical connection between the second touch electrode and the fourth touch electrode, wherein the second bridge has a shape symmetrical to the first bridge, the second bridge passes through an area of the third touch electrode, and an electrode metal pattern of the third touch electrode is absent in the same direction as a direction of the second bridge in an area through which the second bridge passes.

21. The touch display device of claim 20, wherein the first bridge and the second bridge are separated from each other or integrated with each other.

22. The touch display device of claim 18, wherein the bridge layer disposed below or above the touch electrode layer.

23. The touch panel of claim 18, wherein the dummy space is greater than a size of each opening of the second mesh form to adjust capacitance of the plurality of touch electrode.

* * * * *